(12) United States Patent
Wakayama et al.

(10) Patent No.: US 11,815,815 B2
(45) Date of Patent: *Nov. 14, 2023

(54) COMPOSITION FOR FORMING SILICON-CONTAINING RESIST UNDERLAYER FILM REMOVABLE BY WET PROCESS

(71) Applicant: NISSAN CHEMICAL INDUSTRIES, LTD., Tokyo (JP)

(72) Inventors: Hiroyuki Wakayama, Toyama (JP); Makoto Nakajima, Toyama (JP); Wataru Shibayama, Toyama (JP); Masahisa Endo, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/522,493

(22) PCT Filed: Nov. 6, 2015

(86) PCT No.: PCT/JP2015/081345
§ 371 (c)(1),
(2) Date: Apr. 27, 2017

(87) PCT Pub. No.: WO2016/080217
PCT Pub. Date: May 26, 2016

(65) Prior Publication Data
US 2017/0371242 A1    Dec. 28, 2017

(30) Foreign Application Priority Data

Nov. 19, 2014  (JP) ................... 2014-234591

(51) Int. Cl.
*G03F 7/075* (2006.01)
*G03F 7/11* (2006.01)
*G03F 7/38* (2006.01)
*G03F 7/40* (2006.01)
*G03F 7/09* (2006.01)
*C09D 4/00* (2006.01)
*C09D 183/04* (2006.01)
(Continued)

(52) U.S. Cl.
CPC ............ *G03F 7/0752* (2013.01); *C09D 4/00* (2013.01); *C09D 183/02* (2013.01); *C09D 183/04* (2013.01); *C09D 183/06* (2013.01); *G03F 7/091* (2013.01); *G03F 7/11* (2013.01); *G03F 7/2004* (2013.01); *G03F 7/38* (2013.01); *G03F 7/40* (2013.01); *H01L 21/02123* (2013.01); *H01L 21/311* (2013.01); *C08G 77/14* (2013.01)

(58) Field of Classification Search
CPC . G03F 7/38; G03F 7/2004; G03F 7/40; G03F 7/0752; G03F 7/11; G03F 7/091; G03F 7/20; G03F 7/075; C09D 183/06; C09D 183/02; C09D 183/04; C09D 4/00; C08G 77/14; C08G 77/16; C08G 77/18; C08G 77/20
See application file for complete search history.

(56) References Cited

U.S. PATENT DOCUMENTS 7,202,013 B2 *   4/2007   Ogihara ............... C09D 183/04
                                                427/387
9,442,377 B1 *   9/2016   Ongayi .................. G03F 7/168
(Continued)

FOREIGN PATENT DOCUMENTS

JP    H11-258813 A    9/1999
JP    2004-157469 A   6/2004
(Continued)

OTHER PUBLICATIONS

Machine translation of JP 2005-221534 (2005).*
(Continued)

*Primary Examiner* — Martin J Angebranndt
(74) *Attorney, Agent, or Firm* — Oliff PLC

(57) ABSTRACT

Provided is a resist underlayer film-forming composition for forming resist underlayer film usable as hard mask and removable by wet etching process using chemical solution such as sulfuric acid/hydrogen peroxide. A resist underlayer film-forming composition for lithography includes a component (A) and component (B), the component (A) includes a hydrolyzable silane, hydrolysis product thereof, or hydrolysis-condensation product thereof, the hydrolyzable silane includes hydrolyzable silane of Formula (1): $R^1{}_a R^2{}_b Si(R^3)_{4-(a+b)}$ (where $R^1$ is organic group of Formula (2):

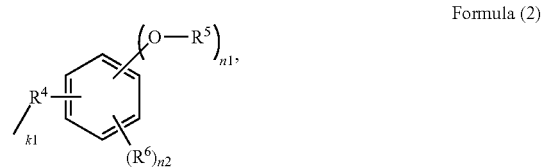

Formula (2)

and is bonded to silicon atom through a Si—C bond; $R^3$ is an alkoxy group, acyloxy group, or halogen group; is an integer of 1; b is an integer of 0 to 2; and a+b is an integer of 1 to 3), and the component (B) is cross-linkable compound having ring structure having alkoxymethyl group or hydroxymethyl group, cross-linkable compound having epoxy group or blocked isocyanate group.

19 Claims, No Drawings

(51) Int. Cl.
- C09D 183/06 (2006.01)
- C09D 183/02 (2006.01)
- C08G 77/14 (2006.01)
- H01L 21/02 (2006.01)
- H01L 21/31 (2006.01)
- G03F 7/20 (2006.01)
- H01L 21/311 (2006.01)

(56) References Cited

U.S. PATENT DOCUMENTS

| | | | |
|---|---|---|---|
| 9,580,623 B2* | 2/2017 | Tachibana | H01L 21/31144 |
| 9,627,204 B2* | 4/2017 | Ogihara | G03F 7/0751 |
| 9,902,875 B2* | 2/2018 | Tachibana | C09D 185/04 |
| 2003/0198877 A1* | 10/2003 | Pfeiffer | G03F 7/0757 430/15 |
| 2005/0112383 A1 | 5/2005 | Tanaka et al. | |
| 2005/0282090 A1* | 12/2005 | Hirayama | C09D 5/32 430/322 |
| 2007/0190457 A1* | 8/2007 | Nakashima | G03F 7/0045 430/270.1 |
| 2008/0160461 A1* | 7/2008 | Yoon | G03F 7/11 430/323 |
| 2009/0042133 A1* | 2/2009 | Xiang | C08L 61/32 430/286.1 |
| 2009/0136869 A1* | 5/2009 | Ogihara | C08G 77/56 430/270.1 |
| 2010/0086870 A1* | 4/2010 | Ogihara | C08G 77/14 430/270.1 |
| 2010/0086878 A1* | 4/2010 | Hatakeyama | H01L 21/0337 430/324 |
| 2010/0102321 A1* | 4/2010 | Abe | G03F 7/022 257/59 |
| 2010/0147334 A1* | 6/2010 | Ogihara | G03F 7/423 134/26 |
| 2012/0178261 A1* | 7/2012 | Kanno | C08G 77/04 438/703 |
| 2012/0183908 A1* | 7/2012 | Anno | G03F 7/0397 430/325 |
| 2012/0276483 A1* | 11/2012 | Ogihara | G03F 7/0752 430/319 |
| 2013/0005150 A1* | 1/2013 | Ogihara | C08L 83/06 438/694 |
| 2013/0045601 A1* | 2/2013 | Ogihara | G03F 7/091 438/694 |
| 2013/0210236 A1* | 8/2013 | Ogihara | C09D 183/06 438/706 |
| 2013/0284698 A1* | 10/2013 | Ogihara | G03F 7/0002 216/48 |
| 2013/0284699 A1* | 10/2013 | Ogihara | G03F 7/0002 216/48 |
| 2013/0302991 A1* | 11/2013 | Kanno | G03F 7/36 438/703 |
| 2014/0093825 A1* | 4/2014 | Ogihara | G03F 7/0035 430/323 |
| 2014/0227641 A1* | 8/2014 | Glodde | G03F 7/0757 430/272.1 |
| 2014/0232018 A1* | 8/2014 | Shigaki | G03F 7/11 257/798 |
| 2014/0272722 A1* | 9/2014 | Nakafuji | C08G 65/4006 430/323 |
| 2014/0377957 A1* | 12/2014 | Takeda | H01L 21/0274 438/703 |
| 2015/0004791 A1* | 1/2015 | Ogihara | G03F 7/11 438/703 |
| 2015/0079792 A1* | 3/2015 | Shigaki | H01L 21/3081 438/703 |
| 2015/0249012 A1* | 9/2015 | Kanno | C09D 183/06 438/702 |
| 2016/0251546 A1* | 9/2016 | Nakajima | C09D 1/00 438/695 |
| 2017/0146906 A1* | 5/2017 | Nakajima | C08G 77/28 |
| 2018/0181000 A1* | 6/2018 | Nakajima | G03F 7/168 |
| 2018/0335698 A1* | 11/2018 | Nakajima | C09D 183/00 |

FOREIGN PATENT DOCUMENTS

| | | | |
|---|---|---|---|
| JP | 2004341479 A | 12/2004 | |
| JP | 2005-173552 A | 6/2005 | |
| JP | 2005-221534 A | 8/2005 | |
| JP | 2005-523474 A | 8/2005 | |
| JP | 2007-163846 A | 6/2007 | |
| JP | 2007-199653 * | 8/2007 | G03F 7/11 |
| JP | 2009-103831 A | 5/2009 | |
| JP | 2010-085912 A | 4/2010 | |
| JP | 2012-078797 A | 4/2012 | |
| WO | 03/089992 A1 | 10/2003 | |
| WO | 2011/033965 A1 | 3/2011 | |
| WO | 2012/102261 A1 | 8/2012 | |
| WO | WO-2012102261 A1 * | 8/2012 | C08G 77/14 |
| WO | 2013/051558 A1 | 4/2013 | |
| WO | WO-2013161372 A1 * | 10/2013 | C08K 5/5455 |

OTHER PUBLICATIONS

JP 2009-126940 Derwent Abstract (2009).*
Schacht et al. "Acid labile crosslinked units: A new concept for deep-UV photoresists" J. Photopolymer. Sci. Technol., vol. 9(4) pp. 573-586 (1996).*
Jan. 26, 2016 Written Opinion issued with International Patent Application No. PCT/JP2015/081345.
Jan. 26, 2016 International Search Report issued with International Patent Application No. PCT/JP2015/081345.
Nov. 29, 2017 Written Opinion issued in Singaporean Application No. 11201703607R.

* cited by examiner

COMPOSITION FOR FORMING SILICON-CONTAINING RESIST UNDERLAYER FILM REMOVABLE BY WET PROCESS

TECHNICAL FIELD

The present invention relates to a resist underlayer film-forming composition for lithography for forming an underlayer film used as a layer under a photoresist in a lithography process for the manufacture of semiconductor devices.

BACKGROUND ART

A film known as a hard mask containing metal elements, such as silicon and titanium, has been used as an underlayer film between a semiconductor substrate and a photoresist (refer to Patent Documents 1 and 2). In this case, the photoresist and the hard mask are significantly different in components, and the rates to remove these by dry etching are greatly dependent on the types of gas used for dry etching. Therefore, the appropriate selection of a gas type allows the hard mask to be removed by dry etching without a large reduction in the film thickness of the photoresist. Thus, in the manufacture of semiconductor devices in recent years, a resist underlayer film has been increasingly disposed between a semiconductor substrate and a photoresist to achieve various effects such as an anti-reflection effect.

These underlayer films need to be removed after the processing of a substrate. In addition, when a problem arises in an underlayer film formed on a substrate, sometimes the underlayer film is removed and reprocessing is performed. Therefore, the removal of an underlayer film has been carried out by dry etching using a fluorine-based gas or by wet etching using hydrofluoric acid, buffered hydrofluoric acid or the like. However, these removal methods also gave a serious damage to a substrate.

Therefore, there has been desired an underlayer film that is removable by wet etching using a chemical solution of, for example, sulfuric acid/hydrogen peroxide that exhibits less damage to a substrate.

As a material that satisfies this demand, there has been proposed a resist underlayer film-forming composition including a combination of a trihydric or higher hydric alcohol and a silicon-containing compound obtained by the hydrolysis condensation of a hydrolyzable silicon compound by making use of an acid as a catalyst (See Patent Document 3).

PRIOR ART DOCUMENTS

Patent Documents

Patent Document 1: Japanese Unexamined Patent Application Publication No. H11-258813 (JP H11-258813 A)
Patent Document 2: Japanese Unexamined Patent Application Publication No. 2007-163846 (JP 2007-163846 A)
Patent Document 3: Japanese Unexamined Patent Application Publication No. 2010-085912 (JP 2010-085912 A)

SUMMARY OF THE INVENTION

Problem to be Solved by the Invention

It is an object of the present invention to provide a resist underlayer film-forming composition for lithography for forming a resist underlayer film usable as a hard mask.

It is an object of the present invention to provide a resist underlayer film-forming composition for forming a resist underlayer film that is removable not only by a conventional dry etching process using a fluorine-based gas or a conventional wet etching process using hydrofluoric acid or buffered hydrofluoric acid, but also by a wet etching process using a chemical solution of, for example, sulfuric acid/hydrogen peroxide that exhibits less damage to a substrate.

Means for Solving the Problem

The present invention provides:
according to a first aspect, a resist underlayer film-forming composition for lithography, the composition comprising a component (A) and a component (B), the component (A) including a hydrolyzable silane, a hydrolysis product thereof, or a hydrolysis-condensation product thereof, the hydrolyzable silane including a hydrolyzable silane of Formula (1):

$$R^1{}_a R^2{}_b Si(R^3)_{4-(a+b)} \quad \text{Formula (1)}$$

[where $R^1$ is an organic group of Formula (2):

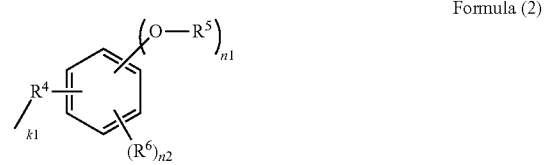

Formula (2)

(where $R^4$ is an alkylene group, a cyclic alkylene group, an alkenylene group, an arylene group, a sulfur atom, an oxygen atom, an oxycarbonyl group, an amide group, a secondary amino group, or a combination thereof; $R^5$ is a hydrogen atom, a $C_{1\text{-}10}$ alkyl group, a $C_{6\text{-}40}$ aryl group, a $C_{2\text{-}10}$ alkenyl group, an alkoxyalkyl group, a sulfur atom, a carbonyl group, an acyl group, or a combination thereof; $R^6$ is a $C_{1\text{-}10}$ alkyl group; n1 satisfies 1≤n1≤5; n2 satisfies 0≤n2≤4; and a k1 portion is a bond to a silicon atom), and is bonded to a silicon atom through a Si—C bond; $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or a combination thereof, and is bonded to a silicon atom through a Si—C bond; $R^3$ is an alkoxy group, an acyloxy group, or a halogen group; a is an integer of 1; b is an integer of 0 to 2; and a+b is an integer of 1 to 3],
the component (B) being a cross-linkable compound having a ring structure having an alkoxymethyl group or a hydroxymethyl group, or a cross-linkable compound having an epoxy group or a blocked isocyanate group;
according to a second aspect, the resist underlayer film-forming composition according to the first aspect, in which the hydrolyzable silane is a combination of the hydrolyzable silane of Formula (1) and other hydrolyzable silane, the other hydrolyzable silane being at least one hydrolyzable silane selected from the group consisting of a hydrolyzable silane of Formula (3):

$$R^7{}_c Si(R^8)_{4-c} \quad \text{Formula (3)}$$

(where $R^7$ is an alkyl group, an aryl group, a halogenated alkyl group, a halogenated aryl group, an alkenyl group, an acyloxyalkyl group, or an organic group having a urea group, an epoxy group, an acryloyl group, a methacryloyl group, a mercapto group, or a cyano group, or a combination thereof, and is bonded to a silicon atom through a Si—C bond; $R^8$ is an alkoxy group, an acyloxy group, or a halogen group; and c is an integer of 0 to 3), and a hydrolyzable silane of Formula (4):

$$[R^9{}_dSi(R^{10})_{3-d}]_2Y_e \quad \text{Formula (4)}$$

(where $R^9$ is an alkyl group and is bonded to a silicon atom through a Si—C bond; $R^{10}$ is an alkoxy group, an acyloxy group, or a halogen group; Y is an alkylene group or an arylene group; d is an integer of 0 or 1; and e is an integer of 0 or 1);

according to a third aspect, a resist underlayer film-forming composition, the composition including, as an underlayer film-forming polymer, a hydrolysis-condensation product of a hydrolyzable silane comprising a combination of the hydrolyzable silane of Formula (1) as described in the first aspect and the hydrolyzable silane of Formula (3) as described in the second aspect;

according to a fourth aspect, the resist underlayer film-forming composition according to any one of the first aspect to the third aspect, the composition comprising the component (A) and the component (B), and further comprising a component (C), in which the component (C) includes a hydrolyzable silane, a hydrolysis product thereof, or a hydrolysis-condensation product thereof, the hydrolyzable silane being a hydrolyzable silane of Formula (5), a combination of the hydrolyzable silane of Formula (5) and the hydrolyzable silane of Formula (3), or a combination of the hydrolyzable silane of Formula (5), the hydrolyzable silane of Formula (3), and the hydrolyzable silane of Formula (4):

$$R^{11}{}_aR^{12}{}_bSi(R^{13})_{4-(a+b)} \quad \text{Formula (5)}$$

(where $R^{11}$ is an organic group having an acyloxy group, a sulfonamide group, or a t-butyl ester group, and is bonded to a silicon atom through a Si—C bond; $R^{12}$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or a combination thereof, and is bonded to a silicon atom through a Si—C bond; $R^{13}$ is an alkoxy group, an acyloxy group, or a halogen group; a is an integer of 1; b is an integer of 0 to 2; and a+b is an integer of 1 to 3);

according to a fifth aspect, the resist underlayer film-forming composition according to any one of the first aspect to the fourth aspect, in which the alkoxymethyl group of the component (B) is a methoxymethyl group;

according to a sixth aspect, the resist underlayer film-forming composition according to any one of the first aspect to the fifth aspect, the composition further comprising an acid;

according to a seventh aspect, a method for forming a resist underlayer film, the method comprising the step of applying the resist underlayer film-forming composition as described in any one of the first aspect to the sixth aspect onto a semiconductor substrate and baking the applied coating to form an underlayer film;

according to an eighth aspect, a method for manufacturing a semiconductor device, the method comprising the steps of: applying the resist underlayer film-forming composition as described in any one of the first aspect to the sixth aspect onto a semiconductor substrate, and baking the applied coating to form a resist underlayer film; applying a resist composition onto the underlayer film to form a resist film; exposing the resist film to light; developing the resist after the exposure to obtain a resist pattern; etching the resist underlayer film with the resist pattern; and processing the semiconductor substrate with the patterned resist underlayer film;

according to a ninth aspect, a method for manufacturing a semiconductor device, the method comprising the steps of: forming an organic underlayer film on a semiconductor substrate; applying the resist underlayer film-forming composition as described in any one of the first aspect to the sixth aspect onto the organic underlayer film and baking the applied coating to form a resist underlayer film; applying a resist composition onto the resist underlayer film to form a resist film; exposing the resist film to light; developing the resist after the exposure to obtain a resist pattern; etching the resist underlayer film with the resist pattern; etching the organic underlayer film with the patterned resist underlayer film; and processing the semiconductor substrate with the patterned organic underlayer film;

according to a tenth aspect, the method for manufacturing a semiconductor device as described in the ninth aspect, the method further comprising the step of, after the processing of the semiconductor substrate, removing the patterned resist underlayer film and/or the patterned organic underlayer film by a chemical solution; and according to an eleventh aspect, the method for manufacturing a semiconductor device according to the tenth aspect, in which the chemical solution used for the removal is a mixed solution of sulfuric acid and hydrogen peroxide.

Effects of the Invention

The resist underlayer film-forming composition for lithography according to the present invention can be used for the manufacture of semiconductor devices.

Furthermore, the resist underlayer film-forming composition for lithography for forming a resist underlayer film according to the present invention can be used as a hard mask, and furthermore, can be used as an anti-reflective coating, depending on the wavelength of an exposure light to be used.

Furthermore, the resist underlayer film is removable not only by a conventional dry etching process using a fluorine-based gas or a conventional wet etching process using hydrofluoric acid or buffered hydrofluoric acid, but also by a wet etching process using a chemical solution of, for example, sulfuric acid/hydrogen peroxide that exhibits less damage to a substrate.

MODES FOR CARRYING OUT THE INVENTION

The present invention provides a resist underlayer film-forming composition for lithography, the composition comprising a component (A) and a component (B), in which the component (A) includes a hydrolyzable silane, a hydrolysis product thereof, or a hydrolysis-condensation product thereof; the hydrolyzable silane includes a hydrolyzable silane of Formula (1); and the component (B) is a cross-linkable compound having a ring structure having an alkoxymethyl group or a hydroxymethyl group, or a crosslinkable compound having an epoxy group or a blocked isocyanate group.

The resist underlayer film-forming composition according to the present invention includes: a hydrolyzable silane of Formula (1), a hydrolysis product thereof, or a hydrolysis-condensation product thereof; and a solvent. Furthermore, the resist underlayer film-forming composition may include an acid, water, alcohol, a curing catalyst, an acid generator, other organic polymers, a light-absorbing compound, and a surfactant, as optional components.

The resist underlayer film-forming composition according to the present invention has a solid content of, for example, 0.1% by mass to 50% by mass, 0.1% by mass to 30% by mass, or 0.1% by mass to 25% by mass. Here, the solid content refers to the amount of residual components after subtracting a solvent component from all components of the resist underlayer film-forming composition.

The ratio of the hydrolyzable silane, the hydrolysis product thereof, and the hydrolysis-condensation product thereof in the solid contents is 20% by mass or more, for example, 50% by mass to 100% by mass, 60% by mass to 99% by mass, or 70% by mass to 99% by mass.

Furthermore, the above-mentioned hydrolyzable silane, a hydrolysis product thereof, and a hydrolysis-condensation product thereof may be used in the form of a mixture thereof. A condensation product obtained by hydrolyzing the hydrolyzable silane and condensing the resulting hydrolysis product may be used. Furthermore, a mixture may be used that is obtained by mixing a hydrolysis-condensation product with a silane compound or a partial-hydrolysis product resulting from imperfectly completed hydrolysis for obtaining the hydrolysis-condensation product. Such a condensation product is a polymer having a polysiloxane structure. This polysiloxane includes a hydrolysis-condensation product of the hydrolyzable silane of Formula (1), or a hydrolysis-condensation product of the hydrolyzable silane of Formula (1) and other hydrolyzable silane (for example, the hydrolyzable silane of Formula (3)). Furthermore, the hydrolyzable silane of Formula (1), or a hydrolyzable silane formed of the hydrolyzable silane of Formula (1) and the hydrolyzable silane of Formula (3) may be added to a hydrolysis-condensation product (polysiloxane) of a hydrolysis product of the hydrolyzable silane of Formula (1) or a hydrolyzable silane formed of a combination of the hydrolyzable silane of Formula (1) and the hydrolyzable silane of Formula (3).

In Formula (1), $R^1$ is an organic group of Formula (2) and bonded to a silicon atom through a Si—C bond. $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or the combination of these and is bonded to a silicon atom through a Si—C bond. $R^3$ is an alkoxy group, an acyloxy group, or a halogen group. a is an integer of 1, b is an integer of 0 to 2, and a+b is an integer of 1 to 3.

In Formula (2), $R^4$ is an alkylene group, a cyclic alkylene group, an alkenylene group, an arylene group, a sulfur atom, an oxygen atom, an oxycarbonyl group, an amide group, a secondary amino group, or a combination thereof; $R^5$ is a hydrogen atom, a $C_{1-10}$ alkyl group, a $C_{6-40}$ aryl group, a $C_{2-10}$ alkenyl group, an alkoxyalkyl group, a sulfur atom, a carbonyl group, an acyl group, or a combination thereof; $R^6$ is a $C_{1-10}$ alkyl group; n1 satisfies 1≤n1≤5; n2 satisfies 0≤n2≤4; and a k1 portion is a bond to a silicon atom.

The above-mentioned alkyl group is, for example, a linear or branched alkyl group having a carbon atom number of 1 to 10. Examples of the alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group. These examples are also applied to an alkyl group portion of the above-mentioned halogenated alkyl group.

Furthermore, a cyclic alkyl group may be used, and examples of a cyclic $C_{1-10}$ alkyl group include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group. Besides, a bicyclo group may be used.

The above-mentioned alkylene group may be, for example, alkylene groups derived from the above-mentioned alkyl groups. Examples of such alkylene groups include methylene group derived from methyl group, ethylene group derived from ethyl group, and propylene group derived from propyl group.

The above-mentioned alkenyl group includes a $C_{2-10}$ alkenyl group, and examples of such alkenyl groups include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the above-mentioned alkenylene group include alkenylene groups derived from the above-mentioned alkenyl groups.

The above-mentioned aryl group is, for example, a $C_{6-40}$ aryl group, and examples of such aryl groups include phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, a-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group. These examples are also applied to aryl group portions of the above-mentioned halogenated aryl group and the above-mentioned alkoxyaryl group.

Examples of the above-mentioned arylene group include arylene groups derived from the above-mentioned aryl groups.

Furthermore, examples thereof include organic groups substituted with a halogen atom, such as fluorine, chlorine, bromine, or iodine.

The use of a sulfur atom enables a sulfide bond to be formed. The use of an oxygen atom enables an ether bond to be formed. The use of an oxycarbonyl group enables an ester bond to be formed. The use of an amide group enables an amide bond to be formed. The use of a secondary amino group enables an amino group to be formed. The use of these functional groups and the above-mentioned examples in combination enables each bond to be formed.

Examples of the above-mentioned organic group having an epoxy group include glycidoxymethyl, glycidoxyethyl, glycidoxypropyl, glycidoxybutyl, and epoxycyclohexyl.

Examples of the above-mentioned organic group having an acryloyl group include acryloylmethyl, acryloylethyl, and acryloylpropyl.

Examples of the above-mentioned organic group having a methacryloyl group include methacryloylmethyl, methacryloylethyl, and methacryloylpropyl.

Examples of the above-mentioned organic group having a mercapto group include ethylmercapto, butylmercapto, hexylmercapto, and octylmercapto.

Examples of the above-mentioned organic group having an amino group include aminomethyl, aminoethyl, and aminopropyl.

Examples of the above-mentioned organic group having a cyano group include cyanoethyl and cyanopropyl.

The above-mentioned alkoxyalkyl group is an alkyl group substituted with an alkoxy group, and examples of the alkoxyalkyl group include methoxymethyl group, ethoxymethyl group, ethoxyethyl group, and ethoxymethyl group.

The above-mentioned alkoxy group is, for example, an alkoxy group having a linear, branched, or cyclic $C_{1-20}$ alkyl portion. Examples of such alkoxy groups include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group; and examples of the cyclic alkoxy group include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group. These examples are also applied to an alkoxy group portion of the above-mentioned alkoxyaryl group.

The above-mentioned acyloxy group include $C_{2-20}$ acyloxy group and examples of such acyloxy groups include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the above-mentioned halogen group include fluoride, chloride, bromide, and iodide. These examples may be also applied to halogen group portions of the above-mentioned halogenated alkyl group and halogenated aryl group.

Examples of the hydrolyzable silane of Formula (1) are as follows.

Formula (1-1)

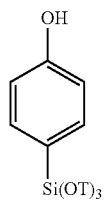

Formula (1-2)

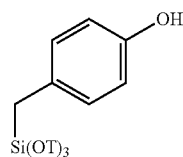

Formula (1-3)

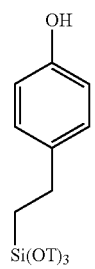

Formula (1-4)

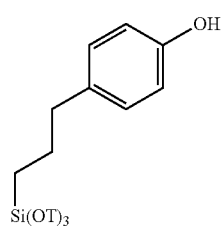

(Formula 1-5)

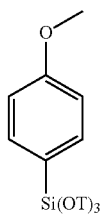

Formula (1-6)

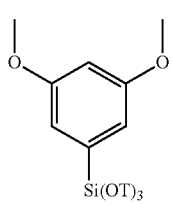

Formula (1-7)

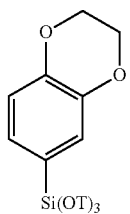

Formula (1-8)

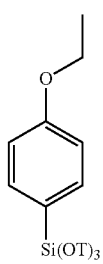

Formula (1-9)

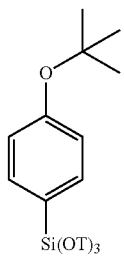

Formula (1-10)

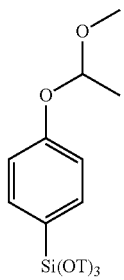

Formula (1-11)
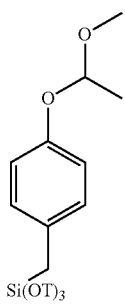
Formula (1-12)
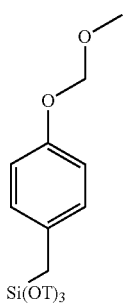
Formula (1-13)
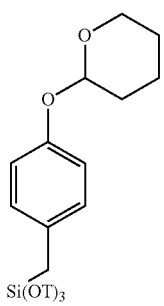
Formula (1-14)
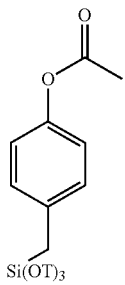
Formula (1-15)
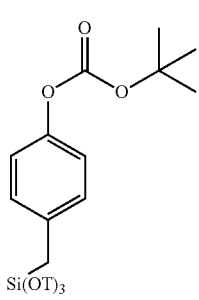
Formula (1-16)
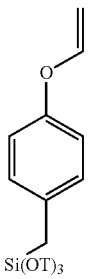
Formula (1-17)
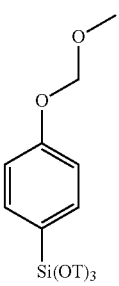
Formula (1-18)
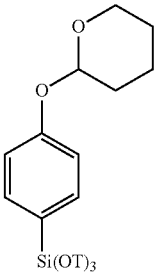
Formula (1-19)
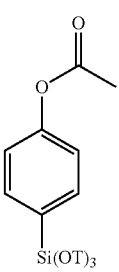
Formula (1-20)
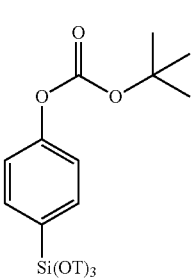

Formula (1-21)
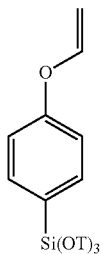
Formula (1-22)
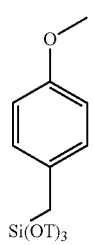
Formula (1-23)
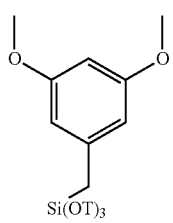
Formula (1-24)
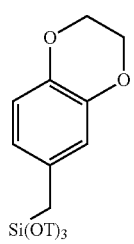
Formula (1-25)
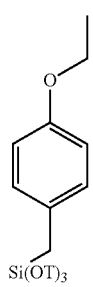
Formula (1-26)
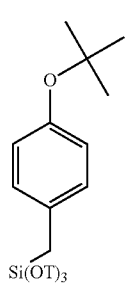
Formula (1-27)
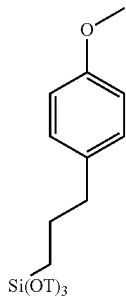
Formula (1-28)
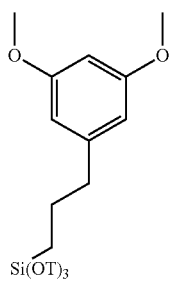
Formula (1-29)
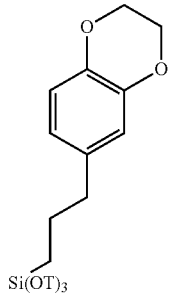
Formula (1-30)
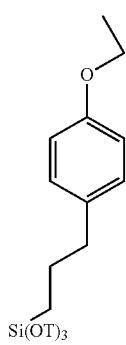
Formula (1-31)
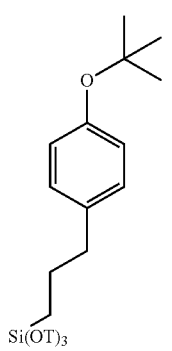

Formula (1-32)
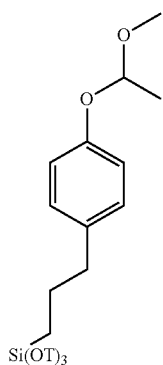
Formula (1-33)
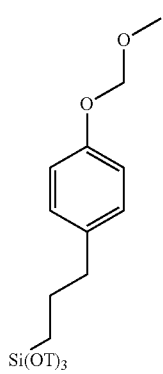
Formula (1-34)
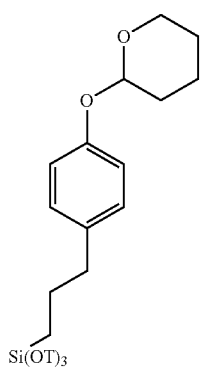
Formula (1-35)
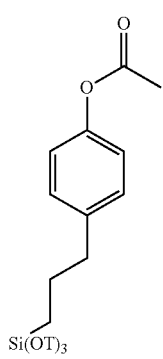
Formula (1-36)
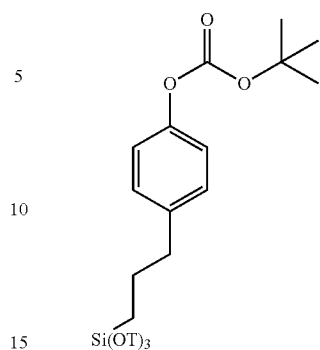
Formula (1-37)
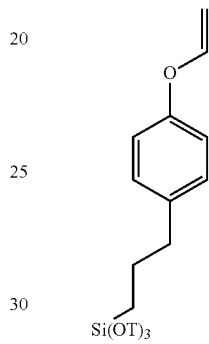
Formula (1-38)
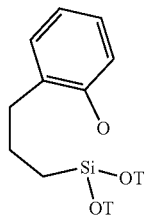
Formula (1-39)
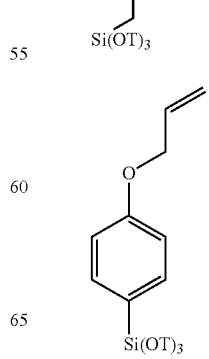
Formula (1-40)

Formula (1-41)

[Structure: allyloxy-phenyl-CH2-Si(OT)3]

Formula (1-42)

[Structure: 1-ethoxyethoxy-phenyl-Si(OT)3]

Formula (1-43)

[Structure: 1-ethoxyethoxy-phenyl-CH2CH2CH2-Si(OT)3]

In the above-mentioned examples of the hydrolyzable silane of Formula (1), T is an alkyl group. Examples of T include the above-mentioned alkyl groups, and preferred examples thereof include methyl group and ethyl group.

In the present invention, as the hydrolyzable silane, a combination of the hydrolyzable silane of Formula (1) and other hydrolyzable silane may be used. As the other hydrolyzable silane, at least one hydrolyzable silane selected from the group consisting of the hydrolyzable silane of Formula (3) and the hydrolyzable silane of Formula (4) may be used.

In Formula (3), $R^7$ is an alkyl group, an aryl group, a halogenated alkyl group, a halogenated aryl group, an alkenyl group, an acyloxyalkyl group, or an organic group having a urea group, an epoxy group, an acryloyl group, a methacryloyl group, a mercapto group, or a cyano group, or a combination thereof, and is bonded to a silicon atom through a Si—C bond; $R^8$ is an alkoxy group, an acyloxy group, or a halogen group; and c is an integer of 0 to 3.

In Formula (4), $R^9$ is an alkyl group and is bonded to a silicon atom through a Si—C bond; $R^{10}$ is an alkoxy group, an acyloxy group, or a halogen group; Y is an alkylene group or an arylene group; d is an integer of 0 or 1; and e is an integer of 0 or 1.

Examples of the alkyl group, the aryl group, the halogenated alkyl group, the halogenated aryl group, the alkenyl group, the organic group having an epoxy group, an acryloyl group, a methacryloyl group, a mercapto group, or a cyano group, the alkoxy group, the acyloxy group, and the halogen group, which are defined in Formula (3) and Formula (4), include the above-mentioned examples.

The acyloxyalkyl group may be, for example, a combination of the above-mentioned acyloxy group and alkyl group, and examples of the combination include acetoxymethyl group, acetoxyethyl group, and acetoxypropyl group.

Examples of the hydrolyzable silane of Formula (3) include tetramethoxysilane, tetrachlorosilane, tetraacetoxysilane, tetraethoxysilane, tetra-n-propoxysilane, tetraisopropoxysilane, tetra-n-butoxysilane, methyltrimethoxysilane, methyltrichlorosilane, methyltriacetoxysilane, methyltripropoxysilane, methyltributoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltrimethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimethoxysilane, isopropoxybenzyltriethoxysilane, isopropoxybenzyltriacetoxysilane, isopropoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, methylvinyldiethoxysilane, acetoxymethyltrimethoxysilane, acetoxyethyltrimethoxysilane, acetoxypropyltrimethoxysilane, acetoxymethyltriethoxysilane, acetoxyethyltriethoxysilane, and acetoxypropyltriethoxysilane.

Examples of the hydrolyzable silane of Formula (4) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Examples of the hydrolyzable silane of Formula (3) may further include the following hydrolyzable silanes.

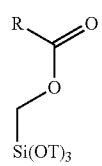

Formula (4-1)

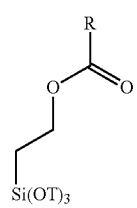

Formula (4-2)

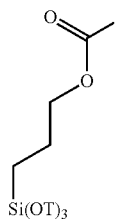

Formula (4-3)

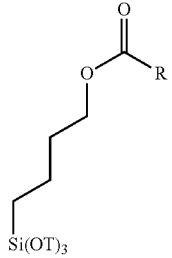

Formula (4-4)

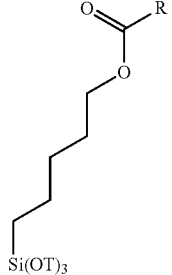

Formula (4-5)

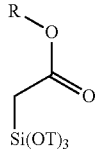

Formula (4-6)

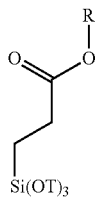

Formula (4-7)

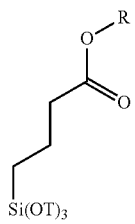

Formula (4-8)

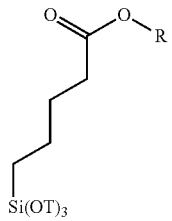

Formula (4-9)

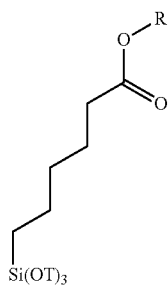
Formula (4-10)
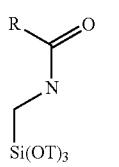
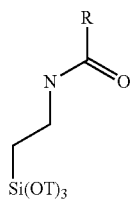
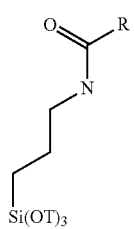
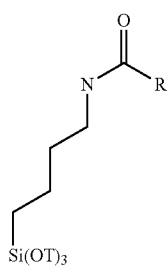
Formula (4-14)
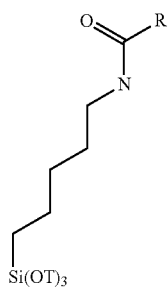
Formula (4-15)
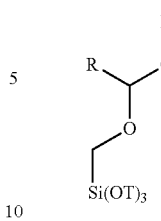
Formula (4-16)
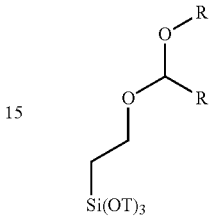
Formula (4-17)
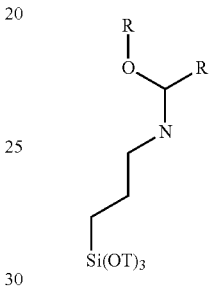
Formula (4-18)
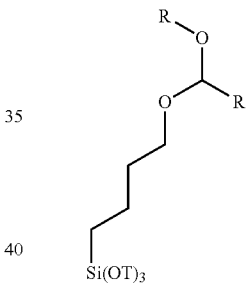
Formula (4-19)
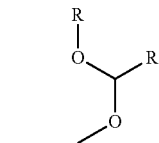
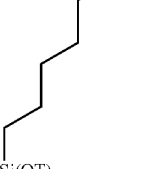
Formula (4-20)
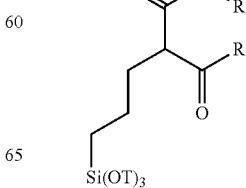
Formula (4-21)

Formula (4-22)
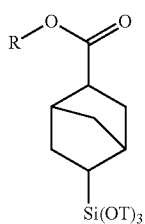
Formula (4-23)
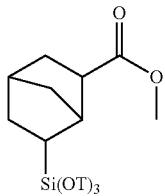
Formula (4-24)
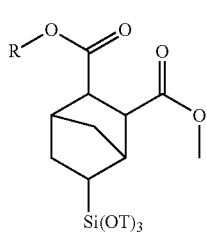
Formula (4-25)
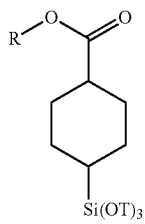
Formula (4-26)
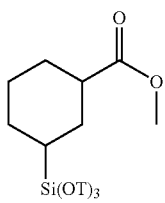
Formula (4-27)
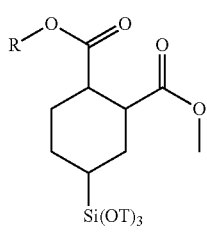
Formula (4-28)
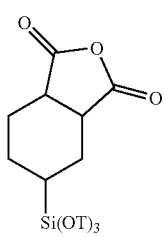
Formula (4-29)
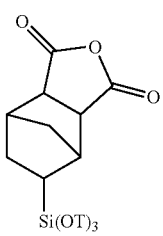
Formula (4-30)
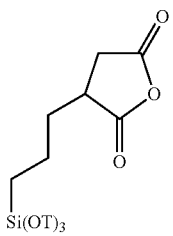
Formula (4-31)
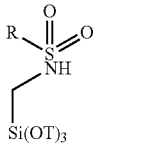
Formula (4-32)
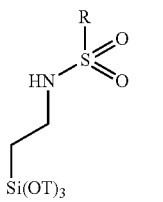
Formula (4-33)
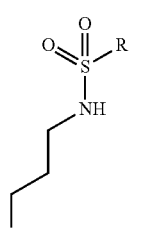
Formula (4-34)
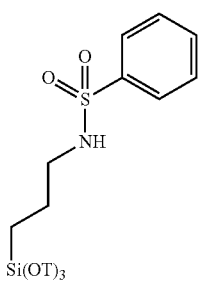

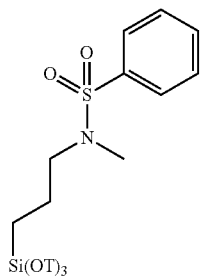
Formula (4-35)

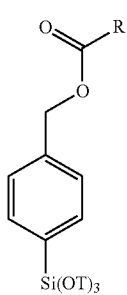
Formula (4-36)

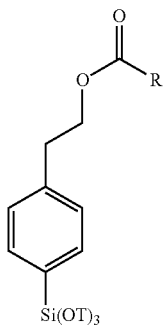
Formula (4-37)

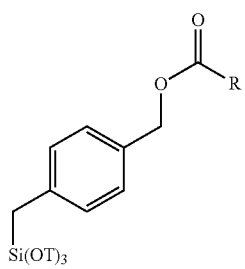
Formula (4-38)

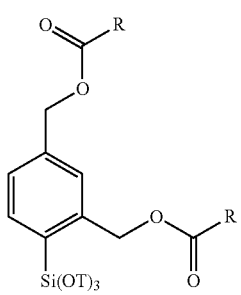
Formula (4-39)

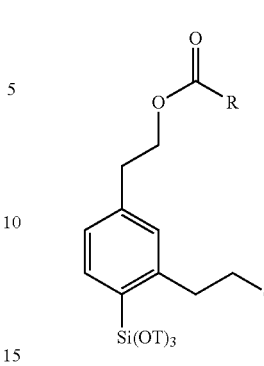
Formula (4-40)

In the above-mentioned examples of the hydrolyzable silane of Formula (3), T is an alkyl group. Examples of T include the above-mentioned alkyl groups, and preferred examples thereof include methyl group and ethyl group.

In the above-mentioned examples of the hydrolyzable silane of Formula (3), R is exemplified as follows.

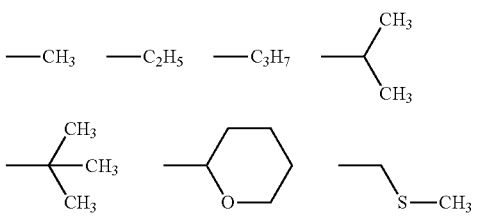

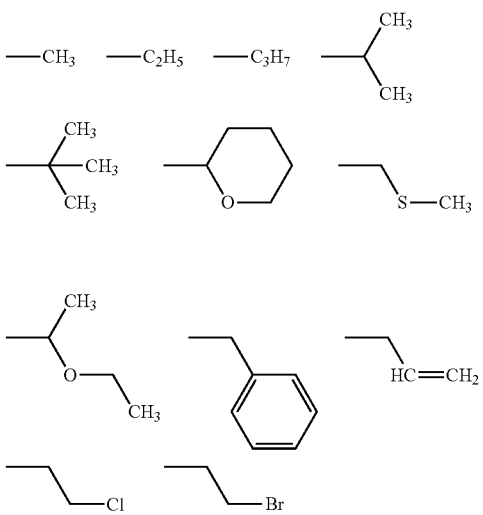

Examples of the component (A) used in the present invention are as follows.

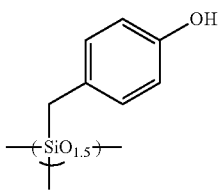
Formula (A-1)

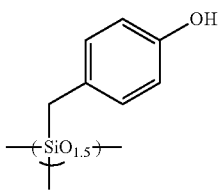
Formula (A-2)

Formula (A-3)

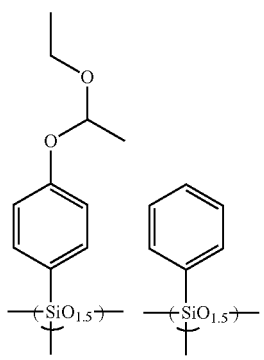

Formula (A-4)

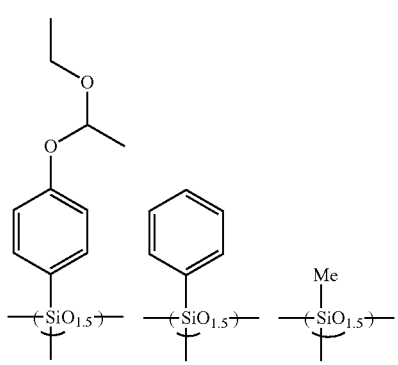

Formula (A-5)

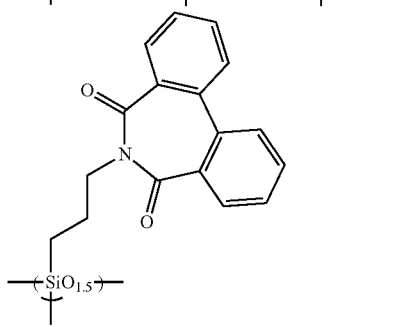

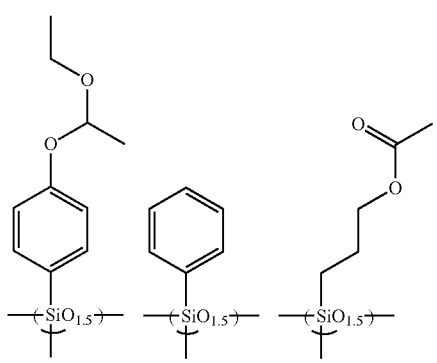

The resist underlayer film-forming composition according to the present invention comprises the above-mentioned component (A) and the above-mentioned component (B), and further comprises the following component (C), in which the component (C) includes a hydrolyzable silane, a hydrolysis product thereof, or a hydrolysis-condensation product thereof, the hydrolyzable silane being the hydrolyzable silane of Formula (5), a combination of the hydrolyzable silane of Formula (5) and the hydrolyzable silane of Formula (3), or a combination of the hydrolyzable silane of Formula (5), the hydrolyzable silane of Formula (3), and the hydrolyzable silane of Formula (4).

In Formula (5), $R^{11}$ is an organic group having an acyloxy group, a sulfonamide group, or a t-butyl ester group, and is bonded to a silicon atom through a Si—C bond; $R^{12}$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or a combination thereof, and is bonded to a silicon atom through a Si—C bond; $R^{13}$ is an alkoxy group, an acyloxy group, or a halogen group; a is an integer of 1; b is an integer of 0 to 2; and a+b is an integer of 1 to 3.

Examples of the alkyl group, the aryl group, the halogenated alkyl group, the halogenated aryl group, the alkoxyaryl group, the alkenyl group, or the organic group having an epoxy group, an acryloyl group, a methacryloyl group, a mercapto group, an amino group or a cyano group, the alkoxy group, the acyloxy group, and the halogen group, which are defined in Formula (5), include the above-mentioned examples.

Furthermore, in the organic group having an acyloxy group, a sulfonamide group, or a t-butyl ester group, the organic group is an alkyl group or a phenyl group, and exemplified by the above-mentioned examples, such as acyloxyalkyl group, phenylsulfonamidealkyl group, bicyclo t-butyl ester group, di-t-butyl ester alkyl group, and acyloxybenzyl group.

Examples of the component (C) used in the present invention are as follows.

Formula (C-1)

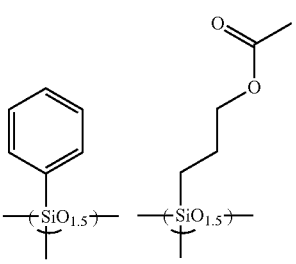

Formula (C-2)

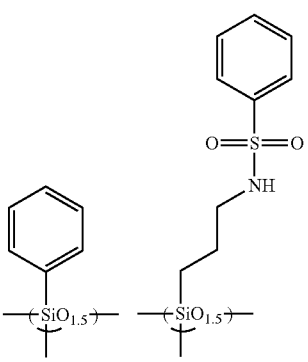

Formula (C-3)

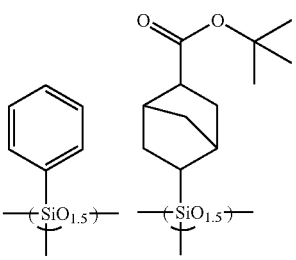

Formula (C-4)

Formula (C-5)

Formula (C-6)

The hydrolysis-condensation product (polyorganosiloxane) of the hydrolyzable silane has a weight-average molecular weight of 1,000 to 1,000,000, or 1,000 to 100,000. These molecular weights are obtained by GPC analysis in terms of polystyrene.

The GPC measurement can be performed under conditions, such as the use of a GPC apparatus (trade name: HLC-8220GPC, manufactured by Tosoh Corporation), GPC columns (trade name: Shodex KF803L, KF802, and KF801, manufactured by Showa Denko K.K.), a column temperature of 40° C., tetrahydrofuran as an eluent (elution solvent), a flow amount (flow rate) of 1.0 mL/min, and a polystyrene (manufactured by Showa Denko K.K.) as a standard sample.

For the hydrolysis of an alkoxysilyl group, an acyloxysilyl group, or a halogenated silyl group, 0.5 mol to 100 mol, preferably 1 mol to 10 mol of water is used per mole of a hydrolysable group.

Furthermore, 0.001 mol to 10 mol, preferably 0.001 mol to 1 mol of a hydrolysis catalyst may be used per mole of a hydrolysable group.

The reaction temperature for hydrolysis and condensation is normally 20° C. to 80° C.

The hydrolysis may be either completely or partially performed. In other words, a hydrolysis product and a monomer may remain in a hydrolysis-condensation product.

A catalyst may be used for the hydrolysis and condensation. Examples of the hydrolysis catalyst include metal chelate compounds, organic acids, inorganic acids, organic bases, and inorganic bases.

Examples of the metal chelate compounds serving as hydrolysis catalysts include: titanium chelate compounds, such as triethoxy mono(acetylacetonato)titanium, tri-n-propoxy mono(acetylacetonato)titanium, tri-i-propoxy mono(acetylacetonato)titanium, tri-n-butoxy mono(acetylacetonato)titanium, tri-sec-butoxy mono(acetylacetonato) titanium, tri-t-butoxy mono(acetylacetonato)titanium, diethoxy bis(acetylacetonato)titanium, di-n-propoxy bis (acetylacetonato)titanium, di-i-propoxy bis(acetylacetonato) titanium, di-n-butoxy bis(acetylacetonato)titanium, di-sec-butoxy bis(acetylacetonato)titanium, di-t-butoxy bis (acetylacetonato)titanium, monoethoxy tris (acetylacetonato)titanium, mono-n-propoxy tris (acetylacetonato)titanium, mono-i-propoxy tris (acetylacetonato)titanium, mono-n-butoxy tris (acetylacetonato)titanium, mono-sec-butoxy tris (acetylacetonato)titanium, mono-t-butoxy tris (acetylacetonato)titanium, tetrakis(acetylacetonato) titanium, triethoxy mono(ethylacetoacetate)titanium, tri-n-propoxy mono(ethylacetoacetate)titanium, tri-i-propoxy mono(ethylacetoacetate)titanium, tri-n-butoxy mono(ethylacetoacetate)titanium, tri-sec-butoxy mono(ethylacetoacetate)titanium, tri-t-butoxy mono(ethylacetoacetate)titanium, diethoxy bis(ethylacetoacetate)titanium, di-n-propoxy bis (ethylacetoacetate)titanium, di-i-propoxy bis(ethylacetoacetate)titanium, di-n-butoxy bis(ethylacetoacetate)titanium, di-sec-butoxy bis(ethylacetoacetate)titanium, di-t-butoxy bis(ethylacetoacetate)titanium, monoethoxy tris(ethylacetoacetate)titanium, mono-n-propoxy tris(ethylacetoacetate) titanium, mono-i-propoxy tris(ethylacetoacetate)titanium, mono-n-butoxy tris(ethylacetoacetate)titanium, mono-sec-butoxy tris(ethylacetoacetate)titanium, mono-t-butoxy tris (ethylacetoacetate)titanium, tetrakis(ethylacetoacetate)titanium, mono(acetylacetonato)tris(ethylacetoacetate) titanium, bis(acetylacetonato)bis(ethylacetoacetate) titanium, and tris(acetylacetonato)mono(ethylacetoacetate) titanium; zirconium chelate compounds, such as triethoxy mono(acetylacetonato)zirconium, tri-n-propoxy mono (acetylacetonato)zirconium, tri-i-propoxy mono(acetylacetonato)zirconium, tri-n-butoxy mono(acetylacetonato)zirconium, tri-sec-butoxy mono(acetylacetonato)zirconium, tri-t-butoxy mono(acetylacetonato)zirconium, diethoxy bis (acetylacetonato)zirconium, di-n-propoxy bis(acetylacetonato)zirconium, di-i-propoxy bis(acetylacetonato)zirconium, di-n-butoxy bis(acetylacetonato)zirconium, di-sec-butoxy bis(acetylacetonato)zirconium, di-t-butoxy bis (acetylacetonato)zirconium, monoethoxy tris (acetylacetonato)zirconium, mono-n-propoxy tris (acetylacetonato)zirconium, mono-i-propoxy tris (acetylacetonato)zirconium, mono-n-butoxy tris (acetylacetonato)zirconium, mono-sec-butoxy tris (acetylacetonato)zirconium, mono-t-butoxy tris (acetylacetonato)zirconium, tetrakis(acetylacetonato) zirconium, triethoxy mono(ethylacetoacetate)zirconium, tri-n-propoxy mono(ethylacetoacetate)zirconium, tri-i-propoxy mono(ethylacetoacetate)zirconium, tri-n-butoxy mono (ethylacetoacetate)zirconium, tri-sec-butoxy mono(ethylacetoacetate)zirconium, tri-t-butoxy mono(ethylacetoacetate) zirconium, diethoxy bis(ethylacetoacetate)zirconium, di-n-propoxy bis(ethylacetoacetate)zirconium, di-i-propoxy bis (ethylacetoacetate)zirconium, di-n-butoxy bis (ethylacetoacetate)zirconium, di-sec-butoxy bis (ethylacetoacetate)zirconium, di-t-butoxy bis (ethylacetoacetate)zirconium, monoethoxy tris (ethylacetoacetate)zirconium, mono-n-propoxy tris (ethylacetoacetate)zirconium, mono-i-propoxy tris (ethylacetoacetate)zirconium, mono-n-butoxy tris (ethylacetoacetate)zirconium, mono-sec-butoxy tris(ethylacetoacetate)zirconium, mono-t-butoxy tris(ethylacetoacetate)zirconium, tetrakis(ethylacetoacetate)zirconium, mono(acetylacetonato)tris(ethylacetoacetate)zirconium, bis(acetylacetonato)bis(ethylacetoacetate)zirconium, and tris(acetylacetonato)mono(ethylacetoacetate)zirconium; and aluminum chelate compounds, such as tris(acetylacetonato)aluminum and tris(ethylacetoacetate)aluminum.

Examples of the organic acid serving as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid serving as the hydrolysis catalyst include hydrochloric acid, nitric acid, sulfuric acid, hydrofluoric acid, and phosphoric acid.

Examples of the organic base serving as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammoniumhydroxide, tetraethylammoniumhydroxide, tetrapropylammoniumhydroxide, tetrabutylammoniumhydroxide, trimethylphenylammoniumhydroxide, benzyltrimethylammoniumhydroxide, and benzyltriethylammoniumhydroxide.

Examples of the inorganic base as hydrolysis catalyst include ammonia, sodium hydroxide, potassium hydroxide, barium hydroxide, and calcium hydroxide. Among these catalysts, the organic bases and the inorganic bases are preferable, and these catalysts may be used alone or in combination of two or more kinds thereof.

Examples of the organic solvent used for the hydrolysis include: aliphatic hydrocarbon-based solvents, such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon-based solvents, such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monohydric alcohol-based solvents, such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol-based solvents, such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerol; ketone-based solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether-based solvents, such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester-based solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, and N-methylpyrrolidone (NMP); and sulfur-containing solvents, such as dimethyl sulfide, diethyl sulfide, thiophene, tetrahydrothiophene, dimethyl sulfoxide, sulfolane, and 1,3-propanesultone. These solvents may be used alone or in combination of two or more kinds thereof.

In particular, ketone-based solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone, are preferable in terms of the preservation stability of the solution.

The component (B) used in the present invention is a cross-linkable compound having a ring structure having an alkoxymethyl group or a hydroxymethyl group, or a crosslinkable compound having an epoxy group or a blocked isocyanate group. As the alkoxymethyl group, methoxymethyl group may be preferably used.

Examples of the cross-linkable compound include a melamine-based compound, a substituted urea-based compound, and a polymer thereof. The cross-linkable compound is preferably a cross-linking agent having at least two cross-linking substituent groups, and examples of the compound include methoxy-methylated glycoluril, butoxy-methylated glycoluril, methoxy-methylated melamine, butoxy-methylated melamine, methoxy-methylated benzoguanamine, butoxy-methylated benzoguanamine, methoxy-methylated urea, butoxy-methylated urea, methoxy-methylated thiourea, and methoxy-methylated thiourea. Condensed products of these compounds may also be used.

Furthermore, as the above-mentioned cross-linking agent, a highly heat-resistant cross-linking agent may be used. As the highly heat-resistant cross-linking agent, a compound including a cross-linking substituent group having an aromatic ring (for example, a benzene ring, or a naphthalene ring) in a molecule may be preferably used.

Examples of this compound include a compound having a partial structure of Formula (6) below, and a polymer or oligomer having a repeating unit of Formula (7) below.

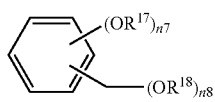

Formula (6)

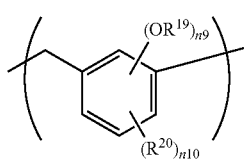

Formula (7)

In Formula (6), $R^{17}$ and $R^{18}$ are independently a hydrogen atom, a $C_{1-10}$ alkyl group, or a $C_{6-20}$ aryl group; n7 is an integer of 1 to 4; n8 is an integer of 1 to (5−n7); and n7+n8 is an integer of 2 to 5. In Formula (7), $R^{19}$ is a hydrogen atom or a $C_{1-10}$ alkyl group; $R^{20}$ is a $C_{1-10}$ alkyl group; n9 is an integer of 1 to 4; n10 is 0 to (4−n9); and n9+n10 is an integer of 1 to 4. An oligomer and a polymer in which the number of repeating unit structures is in a range of 2 to 100 or a range of 2 to 50 may be used. Examples of these alkyl groups and aryl groups include the above-mentioned examples.

Examples of the compound of Formula (6) and the polymer and the oligomer of Formula (7) are shown below.

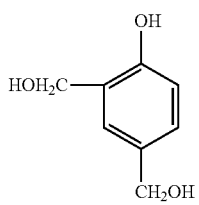

Formula (6-1)

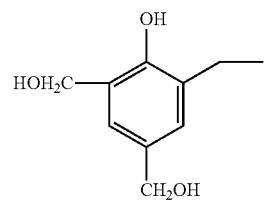

Formula (6-2)

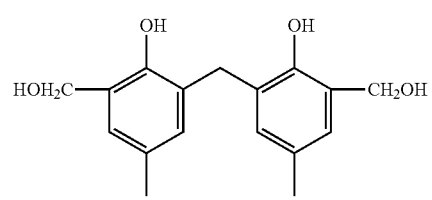

Formula (6-3)

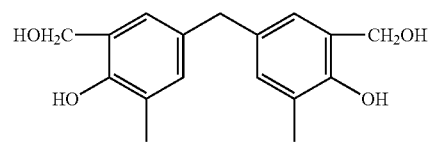

Formula (6-4)

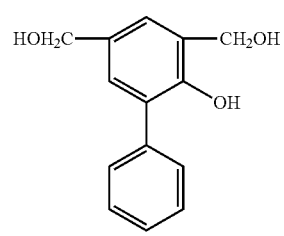

Formula (6-5)

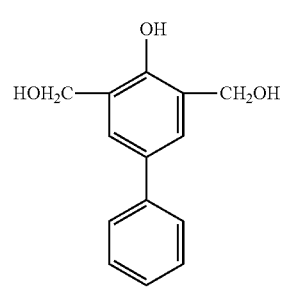

Formula (6-6)

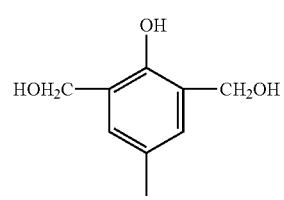

Formula (6-7)

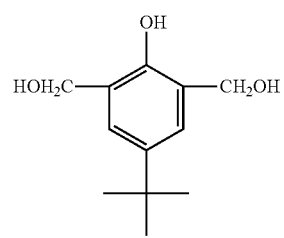

Formula (6-8)

Formula (6-9)
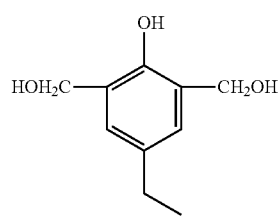
Formula (6-10)
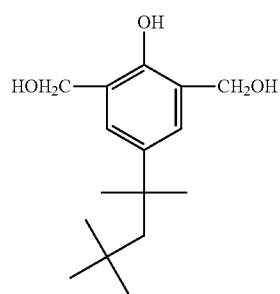
Formula (6-11)
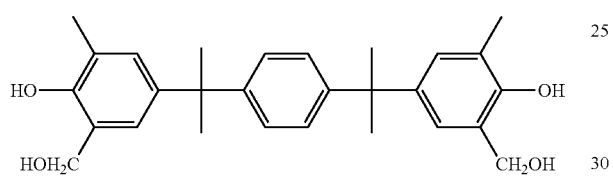
Formula (6-12)
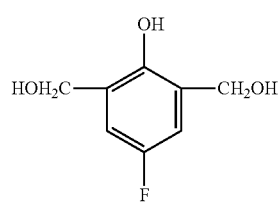
Formula (6-13)
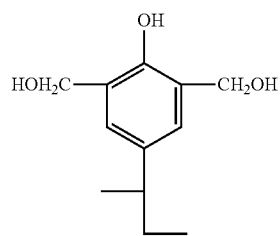
Formula (6-14)
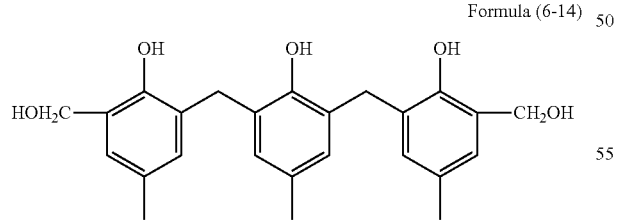
Formula (6-15)
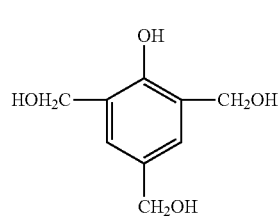
Formula (6-16)
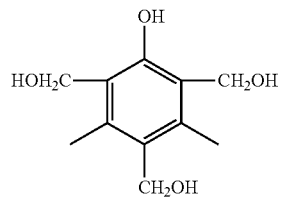
Formula (6-17)
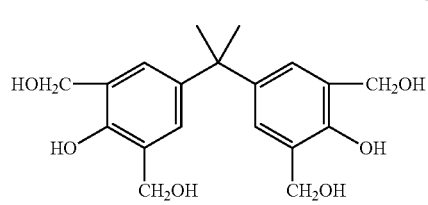
Formula (6-18)
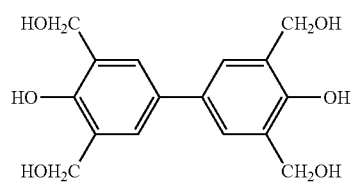
Formula (6-19)
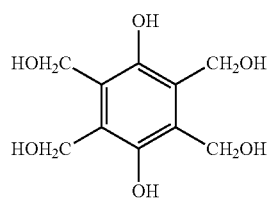
Formula (6-20)
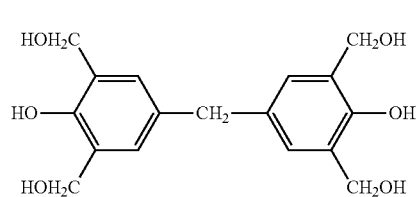
Formula (6-21)
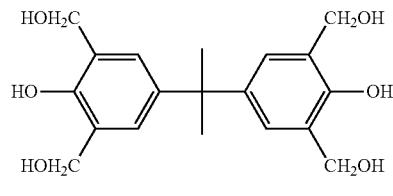
Formula (6-22)
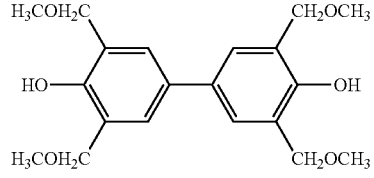
Formula (6-23)
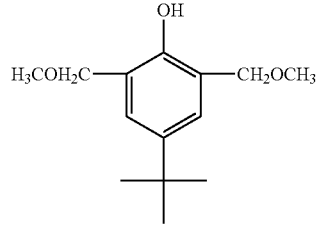

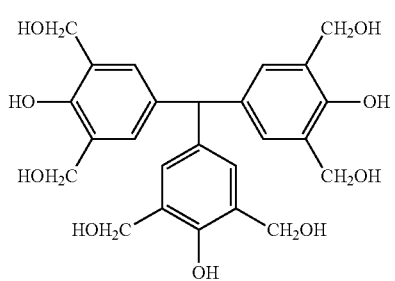

Formula (6-24)

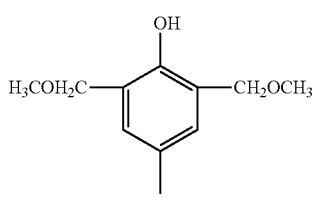

Formula (6-25)

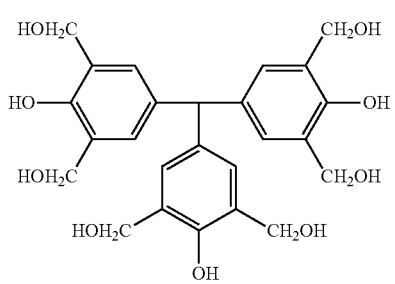

Formula (6-26)

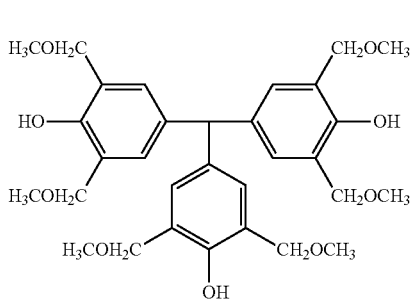

Formula (6-27)

As the above-mentioned compounds, products manufactured by ASAHI YUKIZAI CORPORATION and Honshu Chemical Industry Co., Ltd. are available. For example, as a compound of Formula (6-21) among the above-mentioned cross-linking agents, a compound trade-named TM-BIP-A, manufactured by ASAHI YUKIZAI CORPORATION, is available.

The addition amount of a cross-linkable compound serving as the component (B) depends on, for example, a coating solvent to be used, a base substrate to be used, a required solution viscosity, and a required film form, but is 0.001% by mass to 80% by mass, preferably 0.01% by mass to 50% by mass, and more preferably 0.05% by mass to 40% by mass with respect to the total solid content. These cross-linking agents sometimes cause a cross-linking reaction due to self-condensation, but, when cross-linking substituent groups are present in the above-mentioned polymers according to the present invention, the cross-linking agents can cause a cross-linking reaction with these cross-linking substituent groups.

Furthermore, the resist underlayer film-forming composition used in the present invention may include an acidic compound for accelerating a heating reaction. Examples of the acidic compound include camphorsulfonic acid, citric acid, p-toluenesulfonic acid, pyridinium-p-toluenesulfonate, trifluoromethanesulfonic acid, salicylic acid, sulfosalicylic acid, pyridinium-sulfosalicylate, 4-chlorobenzenesulfonic acid, pyridinium-4-chlorobenzenesulfonate, 4-hydroxybenzenesulfonic acid, pyridinium 4-hydroxybenzenesulfonate, benzenedisulfonic acid, pyridinium-benzenedisulfonate, benzoic acid, hydroxybenzoic acid, 1-naphthalenesulfonic acid, and pyridinium 1-naphthalenesulfonate. These cross-linking catalysts may be used alone, or two or more of them may be used in combination. The cross-linking catalyst may be used in an amount of 0.01 part by mass to 10 parts by mass, 0.05 part by mass to 5 parts by mass, 0.1 part by mass to 3 parts by mass, 0.3 part by mass to 2 parts by mass, or 0.5 part by mass to 1 part by mass with respect to 100 parts by mass of a condensation product (polyorganosiloxane).

Furthermore, the resist underlayer film-forming composition used in the present invention may include an organic polymer compound. The addition of an organic polymer compound allows the adjustment of the dry etching rate (the amount of reduction in film thickness per unit time), the attenuation coefficient, and the refractive index of a resist underlayer film formed from the underlayer film-forming composition for lithography of the present invention.

The organic polymer compound is not limited to a particular compound, and various kinds of organic polymers may be used. For example, polycondensation polymers and addition polymerization polymers may be used. The addition polymerization polymers and the polycondensation polymers to be used include polyesters, polystyrenes, polyimides, acrylic polymers, methacrylic polymers, polyvinyl ethers, phenol novolacs, naphthol novolacs, polyethers, polyamides, and polycarbonates may be used. Organic polymers having aromatic ring structures that function as a light absorbing portion, such as a benzene ring, a naphthalene ring, an anthracene ring, a triazine ring, a quinoline ring, and a quinoxaline ring, are preferably used.

Examples of such organic polymer compounds include: addition polymerization polymers including, as a structural unit thereof, addition polymerizable monomers, such as benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenylmaleimide; and polycondensation polymers, such as phenol novolacs and naphthol novolacs.

In the case where an addition polymerization polymer is used as the organic polymer compound, the polymer compound may be a homopolymer or a copolymer. For the manufacture of the addition polymerization polymer, an addition polymerizable monomer is used. Examples of such addition polymerizable monomers include acrylic acid, methacrylic acid, an acrylic ester compound, a methacrylic ester compound, an acrylamide compound, a methacrylamide compound, a vinyl compound, a styrene compound, a maleimide compound, a maleic anhydride, and acrylonitrile.

Examples of the acrylic ester compound include methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic ester compound include methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyl trimethoxy silane, 2-chloroethyl vinyl ether, 2-methoxyethyl vinyl ether, vinyl naphthalene, and vinyl anthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylmaleimide, N-cyclohexylmaleimide, N-benzylmaleimide, and N-hydroxyethylmaleimide.

In the case of using a polycondensation polymer as the polymer, examples of such polymers include a polycondensation polymer of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Examples of the polycondensation polymer include polyesters, polyamides, and polyimides, such as polypyromellitic imides, poly(p-phenyleneterephthalamide)s, polybutylene terephthalates, and polyethylene terephthalates.

In the case where the organic polymer compound has a hydroxy group, this hydroxy group can cause a crosslinking reaction with a polyorganosiloxane.

As the organic polymer compound, a polymer compound having a weight average molecular weight of, for example, 1,000 to 1,000,000, 3,000 to 300,000, 5,000 to 200,000, or 10,000 to 100,000 may be used.

The organic polymer compound may be used alone or in combination of two or more kinds thereof.

In the case of using the organic polymer compound, the amount of the organic polymer compound used is 1 part by mass to 200 parts by mass, 5 parts by mass to 100 parts by mass, 10 parts by mass to 50 parts by mass, or 20 parts by mass to 30 parts by mass with respect to 100 parts by mass of the condensation product (polyorganosiloxane).

Furthermore, the resist underlayer film-forming composition of the present invention may include an acid generator. Examples of the acid generator include thermal acid generators and photoacid generators. In particular, photoacid generators generate an acid at the time of the light-exposure of a resist. Thus, the acidity of an underlayer film can be adjusted. This is one method for adjusting the acidity of an underlayer film to the acidity of a resist serving as an upper layer of the underlayer film. Furthermore, the adjustment of acidity of an underlayer film allows the pattern shape of a resist formed as an upper layer of the underlayer film to be adjusted.

Examples of the photoacid generator included in the resist underlayer film-forming composition of the present invention include an onium salt compound, a sulfonimide compound, and a disulfonyldiazomethane compound.

Examples of the onium salt compound include: iodonium salt compounds, such as diphenyliodonium hexafluorophosphate, diphenyliodonium trifluoromethanesulfonate, diphenyliodonium nonafluoro normal butanesulfonate, diphenyliodonium perfluoro normal octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoro normal butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photoacid generator may be used alone or in combination of two or more kinds thereof. In the case of using the photoacid generator, the amount of the photoacid generator used is 0.01 part by mass to 5 parts by mass, 0.1 part by mass to 3 parts by mass, or 0.5 part by mass to 1 part by mass with respect to 100 parts by mass of the polycondensation product (polyorganosiloxane).

Furthermore, the resist underlayer film-forming composition according to the present invention may include a surfactant. Surfactants effectively suppress the formation of pinholes and striations when the resist underlayer film-forming composition according to the present invention is applied to a substrate.

Examples of a surfactant included in the resist underlayer film-forming composition of the present invention include: nonionic surfactants, such as polyoxyethylene alkyl ethers including polyoxyethylene lauryl ether, polyoxyethylene stearyl ether, polyoxyethylene cetyl ether, and polyoxyethylene oleyl ether, polyoxyethylene alkylaryl ethers including polyoxyethylene octylphenol ether and polyoxyethylene nonylphenol ether, polyoxyethylene-polyoxypropylene block copolymers, sorbitan fatty acid esters, including sorbitan monolaurate, sorbitan monopalmitate, sorbitan monostearate, sorbitan monooleate, sorbitan trioleate, and sorbitan tristearate, polyoxyethylene sorbitan fatty acid esters, including polyoxyethylene sorbitan monolaurates, polyoxyethylene sorbitan monopalmitates, polyoxyethylene sorbitan monostearates, polyoxyethylene sorbitan trioleates, and polyoxyethylene sorbitan tristearates; fluorine-based surfactants, such as the trade names EFTOP EF301, EF303, and EF352 (manufactured by Tohkem Products Corporation), the trade names MEGAFAC F171, F173, R-08, R-30, R-30N, and R-40LM (manufactured by DIC Corporation), Fluorad FC430 and FC431 (manufactured by Sumitomo 3M Limited), the trade name Asahi Guard AG710 and the trade names SURFLON S-382, SC101, SC102, SC103, SC104, SC105, and SC106 (manufactured by Asahi Glass Co., Ltd.); and an organosiloxane polymer, KP341 (manufactured by Shin-Etsu Chemical Co., Ltd.). These surfactants may be used alone or in combination of two or more kinds thereof. In the case of using the surfactant, the amount of the surfactant used is 0.0001 part by mass to 5 parts by mass, 0.001 part by mass to 1 part by mass, or 0.01 part by mass to 0.5 part by mass with respect to 100 parts by mass of the polycondensation product (polyorganosiloxane).

Furthermore, to the resist underlayer film-forming composition of the present invention, for example, a rheology controlling agent and an adhesion assistant may be added. A rheology controlling agent effectively improves the fluidity of the underlayer film-forming composition. An adhesion assistant effectively improves the adhesion between a semiconductor substrate or a resist and an underlayer film.

Furthermore, to the resist underlayer film-forming composition according to the present invention, bisphenol S or a bisphenol S derivative may be added as an additive. The amount of bisphenol S or a bisphenol S derivative added is 0.01 part by mass to 20 parts by mass, 0.01 part by mass to 10 parts by mass, or 0.01 part by mass to 5 parts by mass with respect to 100 parts by mass of polyorganosiloxane.

Preferred examples of the bisphenol S and the bisphenol S derivative are as follows.

Formula (7-1)
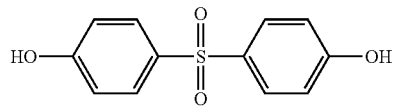

Formula (7-2)
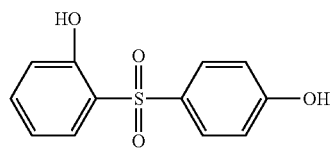

Formula (7-3)
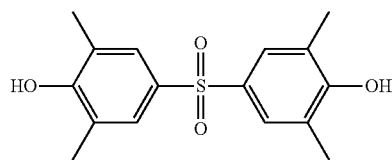

Formula (7-4)
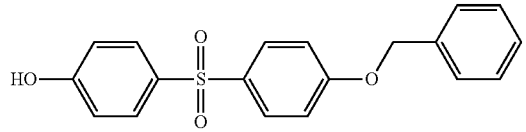

Formula (7-5)
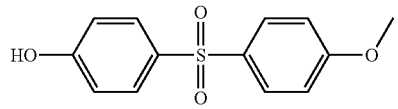

Formula (7-6)
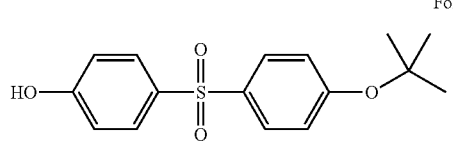

Formula (7-7)
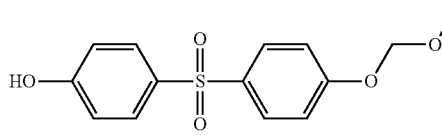

Formula (7-8)
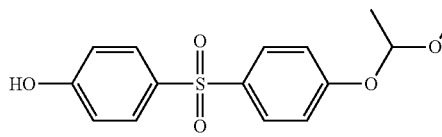

Formula (7-9)
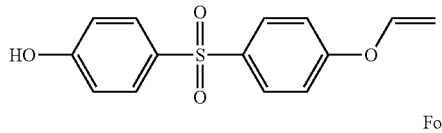

Formula (7-10)
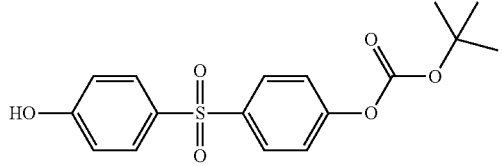

Formula (7-11)
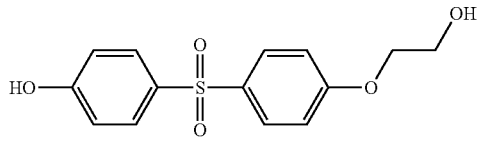

Formula (7-12)
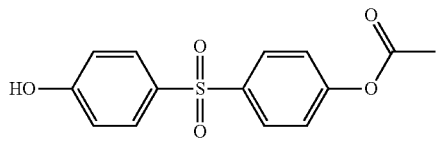

Formula (7-13)
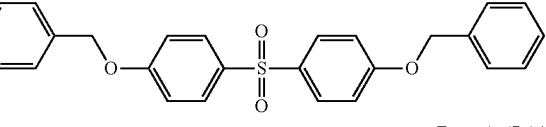

Formula (7-14)
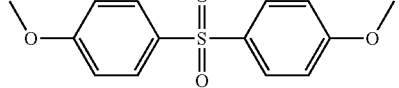

Formula (7-15)
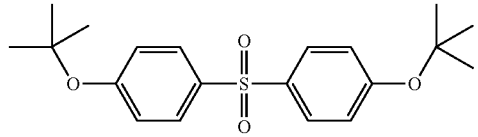

Formula (7-16)
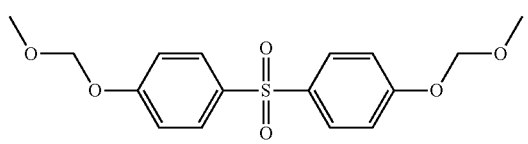

-continued

Formula (7-17)

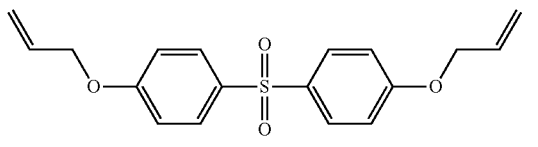

Formula (7-18)

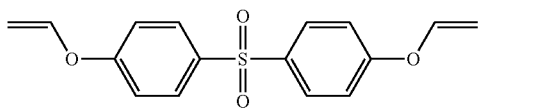

Formula (7-19)

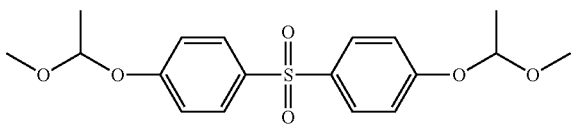

Formula (7-20)

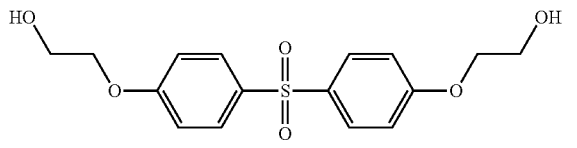

Formula (7-21)

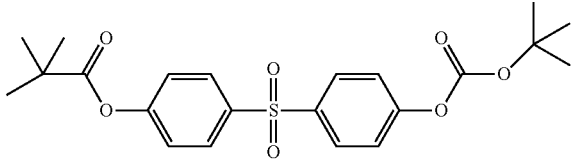

Formula (7-22)

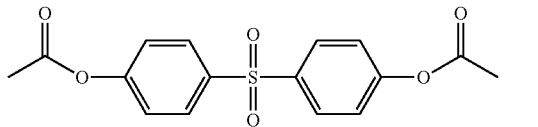

Formula (7-23)

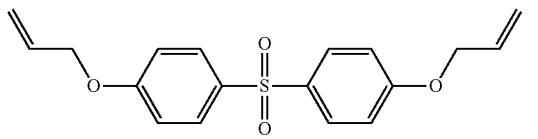

As the solvent used for the resist underlayer film-forming composition of the present invention, a solvent capable of dissolving the above-mentioned solid contents may be used without particular limitations. Examples of such solvents include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol mooethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methybutyrate, ethyl methoxyacetate, ethyl ethoxyacetate, methyl 3-methoxypropionate, ethyl 3-ethoxypropionate, ethyl 3-methoxy propionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents may be used alone or in combination of two or more kinds thereof.

Hereinafter, the usage of the resist underlayer film-forming composition according to the present invention will be described.

The resist underlayer film-forming composition of the present invention is applied to a substrate to form a resist underlayer film on the substrate, or the resist underlayer film-forming composition is applied to an organic underlayer film on a substrate to form a resist underlayer film on the organic underlayer film. On the resist underlayer film, a resist film (for example, photoresist, electron resist) is formed. Then, a resist pattern is formed by exposure and development. Using the resist pattern, the resist underlayer film is dry-etched so that the pattern is transferred thereto, and then, using the pattern, the processing of the substrate or ion implantation thereinto is performed, or the organic underlayer film is etched so that the pattern is transferred thereto, and then, using the organic underlayer film, the processing of the substrate or ion implantation thereinto is performed. Furthermore, the step of wet-etching the resist underlayer film with a chemical solution, such as a mixed solution of sulfuric acid and hydrogen peroxide or a mixed solution of ammonia and hydrogen peroxide, is subsequently performed.

In the formation of a fine pattern, the film thickness of a resist tends to be made thinner for the purpose of preventing pattern collapse. Due to such a thinner resist film, the etching rate of dry etching for transferring a pattern to a film present under the resist film needs to be higher than the etching rate of the upper layer film in order to perform the transfer of the pattern. In the present invention, a resist underlayer film (containing an inorganic silicon-based compound) of the present invention is coated on a substrate via an organic underlayer film or not via an organic underlayer film, and a resist film (an organic resist film) is coated thereon in this order. Depending on a selected etching gas, a film of an organic component and a film of an inorganic component considerably differ in dry etching rate. With the use of an oxygen-based gas, a film of an organic component is dry-etched at a higher rate. In contrast, with the use of a halogen-containing gas, a film of an inorganic component is dry-etched at a higher rate.

For example, a resist pattern is formed, and a resist underlayer film of the present invention under the resist pattern is dry-etched using a halogen-containing gas to transfer the pattern to the resist underlayer film. Using the pattern transferred to the resist underlayer film, a substrate is processed using a halogen-containing gas. Alternatively, using the resist underlayer film to which the pattern is transferred, an organic underlayer film present under the resist underlayer film is dry-etched using an oxygen-based gas to transfer the pattern to the organic underlayer film. Using the organic underlayer film to which the pattern is transferred, a substrate is processed using a halogen-containing gas.

The resist underlayer film according to the present invention is not a cross-linked film formed by a condensation reaction of siloxane obtained by a condensation reaction of silanol groups, but a cross-linked film formed by cross-linking between a cross-linking agent and a hydrolyzable organosilane including a silane compound, a hydrolysis product thereof, or a hydrolysis-condensation product thereof. This underlayer film has a moderate reflectivity to a resist and has dry-etching resistance, for example, in substrate processing, and thus has sufficient functions as a hard mask.

Furthermore, since the underlayer film is not formed by a condensation reaction of siloxane, which cannot be decomposed by wet-etching, but is a cross-linked film formed by cross-linking between a cross-linking agent and a hydrolyzable organosilane including a silane compound, a hydrolysis product thereof, or a hydrolysis-condensation product thereof, the thus-formed resist underlayer film is decomposable and removable by wet-etching.

Here, onto a substrate used for the manufacture of a semiconductor device (for example, a silicon wafer substrate, a silicon/silicon-dioxide coated substrate, a silicon nitride substrate, a glass substrate, an ITO substrate, a polyimide substrate, or a low dielectric constant material (low-k material) coated substrate), the resist underlayer film-forming composition of the present invention is applied by appropriate application means, such as a spinner and a coater, followed by baking to form a resist underlayer film. The baking is performed under the conditions appropriately selected from heating temperatures of 80° C. to 250° C. and heating duration of 0.3 minute to 60 minutes. The baking temperature is preferably 150° C. to 250° C., and the heating duration is preferably 0.5 minute to 2 minutes. Here, the thickness of the underlayer film formed is, for example, 10 nm to 1,000 nm, 20 nm to 500 nm, 30 nm to 300 nm, or 50 nm to 100 nm.

Next, a photoresist layer, for example, is formed on the resist underlayer film. The photoresist layer can be formed by a well-known process, that is, the application of a solution of a photoresist composition onto the underlayer film, followed by baking. The film thickness of the photoresist layer is, for example, 50 nm to 10,000 nm, 100 nm to 2,000 nm, or 200 nm to 1,000 nm.

In the present invention, an organic underlayer film can be formed on a substrate, the resist underlayer film of the present invention can then be formed on the organic underlayer film, and furthermore, a photoresist can be coated on the resist underlayer film. This allows the pattern width of the photoresist to be narrower, and accordingly, even when the photoresist is applied thinly for the purpose of preventing pattern collapse, selecting an appropriate etching gas allows the substrate to be processed. For example, the use of a fluorine-based gas as an etching gas, which results in a significantly high etching rate for a photoresist, allows the resist underlayer film of the present invention to be processed. The use of an oxygen-based gas as an etching gas, which results in a significantly high etching rate for the resist underlayer film of the present invention, allows an organic underlayer film to be processed. Furthermore, the use of a fluorine-based gas as an etching gas, which results in a significantly high etching rate for the organic underlayer film, allows a substrate to be processed.

The photoresist formed on the resist underlayer film of the present invention is not limited to a particular one as long as the photoresist is sensitive to light used for exposure. Both negative and positive photoresists may be used. Examples of the photoresist include a positive photoresist formed of a novolac resin and a 1,2-naphthoquinone diazide sulfonic acid ester; a chemically amplified photoresist formed of a binder having a group that is decomposed by acid to increase an alkali dissolution rate and a photoacid generator; a chemically amplified photoresist formed of a low molecular weight compound that is decomposed by acid to increase an alkali dissolution rate of the photoresist, an alkali-soluble binder, and a photoacid generator; and a chemically amplified photoresist formed of a binder having a group that is decomposed by acid to increase an alkali dissolution rate, a low molecular weight compound that is decomposed by acid to increase an alkali dissolution rate of the photoresist, and a photoacid generator. Examples of the photoresists include the trade name APEX-E, manufactured by Shipley, the trade name PAR710, manufactured by Sumitomo Chemical Company, Limited, and the trade name SEPR430, manufactured by Shin-Etsu Chemical Co., Ltd. Furthermore, examples of the photoresists include fluorine-atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, light exposure is performed through a predetermined mask. For the light exposure, for example, a KrF excimer laser (with a wavelength of 248 nm), an ArF excimer laser (with a wavelength of 193 nm), or an F2 excimer laser (with a wavelength of 157 nm) may be used. After the light exposure, post exposure bake may be performed, if necessary. The post exposure bake is performed under the conditions appropriately selected from heating temperatures of 70° C. to 150° C. and heating duration of 0.3 minute to 10 minutes.

In the present invention, a resist for electron beam lithography or a resist for EUV lithography may be used as a resist in place of a photoresist. Both positive and negative electron beam resists may be used. Examples of the electron beam resists include a chemically amplified resist formed of an acid generator and a binder having a group that is decomposed by acid to change an alkali dissolution rate; a chemically amplified resist formed of an alkali-soluble binder, an acid generator, and a low molecular weight compound that is decomposed by acid to change an alkali dissolution rate of the resist; a chemically amplified resist formed of an acid generator, a binder having a group that is decomposed by acid to change an alkali dissolution rate, and a low molecular weight compound that is decomposed by acid to change an alkali dissolution rate of the resist; a non-chemically amplified resist formed of a binder having a group that is decomposed by an electron beam to change an alkali dissolution rate; and a non-chemically amplified resist formed of a binder having a portion that is cut by an electron beam to change an alkali dissolution rate. Also, in the cases of using these electron beam resists, a resist pattern can be formed using an electron beam as an irradiation source in the same manner as in the case of using a photoresist.

Next, development is performed using a developing solution (for example, an alkaline developing solution). Thus, for example, in the case of using a positive photoresist, an exposed portion of the photoresist is removed to form a pattern of the photoresist.

Examples of the developing solution include alkaline solutions, such as: aqueous solutions of an alkali metal hydroxide, such as potassium hydroxide and sodium hydroxide; aqueous solutions of a quaternary ammonium hydroxide, such as tetramethyl ammonium hydroxide, tetraethyl ammonium hydroxide, and choline; and aqueous solutions of an amine, such as ethanolamine, propylamine, and ethylenediamine. Furthermore, a surfactant or other substances may be added to these developing solutions. The development conditions are appropriately selected from temperatures of 5° C. to 50° C. and duration of 10 seconds to 600 seconds.

Furthermore, in the present invention, an organic solvent may be used as a developing solution. After the light exposure, development is performed using a developing solution (a solvent). Thus, for example, in the case of using a positive photoresist, an unexposed portion of the photoresist is removed to form a pattern of the photoresist.

Examples of the developing solution include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxy propionate, ethyl-3-methoxy propionate, ethyl-3-ethoxy propionate, and propyl-3-methoxy propionate. Furthermore, a surfactant or other substances may be added to these developing solutions. The development conditions are appropriately selected from temperatures of 5° C. to 50° C. and durations of 10 seconds to 600 seconds.

Then, using the thus-formed pattern of the photoresist (upper layer) as a protective film, the resist underlayer film (intermediate layer) of the present invention is removed. Subsequently, using a film formed of the patterned photoresist and the patterned resist underlayer film (intermediate layer) of the present invention as protective films, an organic underlayer film (lower layer) is removed. Finally, using the patterned resist underlayer film (intermediate layer) of the present invention and the patterned organic underlayer film (lower layer) as protective films, a semiconductor substrate is processed.

First, a photoresist-removed portion of the resist underlayer film (intermediate layer) of the present invention is removed by dry etching to make a semiconductor substrate exposed. For the dry etching of the resist underlayer film of the present invention, gases, such as tetrafluoromethane ($CF_4$), parfluorocyclobutane ($C_4F_8$), parfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane may be used. For the dry etching of the resist underlayer film, a halogen-based gas is preferably used. With dry etching using a halogen-based gas, a photoresist formed of an organic substance is basically hard to remove. In contrast, the resist underlayer film of the present invention that contains many silicon atoms is promptly removed by a halogen-based gas. Thus, a reduction in the film thickness of the photoresist that is associated with the dry etching of the resist underlayer film can be suppressed. As a result, a thinner photoresist film can be used. The dry etching of the resist underlayer film is preferably performed using a fluorine-based gas. Examples of the fluorine-based gas include tetrafluoromethane ($CF_4$), parfluorocyclobutane ($C_4F_8$), parfluoropropane ($C_3F_8$), trifluoromethane, and difluoromethane ($CH_2F_2$).

After that, using films formed of the patterned photoresist and the patterned resist underlayer film of the present invention as protective films, the organic underlayer film is removed. The dry etching of the organic underlayer film (lower layer) is preferably performed using an oxygen-based gas. This is because the resist underlayer film of the present invention that contains many silicon atoms is hard to remove by dry etching using an oxygen-based gas.

After that, a semiconductor substrate is processed. The processing of the semiconductor substrate is preferably performed by dry etching using a fluorine-based gas.

Finally, the resist underlayer film is removed. For the removal of the resist underlayer film, dry etching and wet etching are often used, and in particular, for the dry etching of the resist underlayer film (intermediate layer), a fluorine-based gas is preferably used. Examples of the fluorine-based gas include tetrafluoromethane ($CF_4$), parfluorocyclobutane ($C_4F_8$), parfluoropropane ($C_3F_8$), trifluoromethane, and difluoromethane ($CH_2F_2$). Examples of a chemical solution used for the wet etching of the resist underlayer film (intermediate layer) include chemical solutions of hydrofluoric acid, buffered hydrofluoric acid, sulfuric acid/hydrogen peroxide, and ammonia/hydrogen peroxide.

Furthermore, on the resist underlayer film of the present invention, an organic anti-reflective coating may be formed before the formation of a photoresist. An anti-reflective coating composition used for the anti-reflective coating is not limited to a particular one, and may be appropriately selected from various anti-reflective coating compositions that have been commonly used for lithography process. Furthermore, the anti-reflective coating may be formed using a common method, for example, application with a spinner or a coater and baking.

The substrate to which the resist underlayer film-forming composition of the present invention is applied may have an organic or inorganic anti-reflective coating formed thereon by a CVD process or the like, and furthermore, on the anti-reflective coating, an underlayer film formed from the resist underlayer film-forming composition of the present invention may be formed.

Sometimes, depending on the wavelength of light used in a lithography process, the resist underlayer film formed from the resist underlayer film-forming composition of the present invention absorbs the light. In this case, the resist underlayer film can function as an anti-reflective coating having the effect of preventing light reflected from a substrate. Furthermore, the resist underlayer film formed from the resist underlayer film-forming composition of the present invention can be used as, for example, a layer for preventing the interaction between a substrate and a photoresist; a layer having the function of preventing a material used for a photoresist or a substance produced at the time of exposing a photoresist to light from having an adverse effect on a substrate; a layer having the function of preventing a substance produced in a substrate at the time of heating and baking from diffusing to a photoresist serving as an upper layer; a barrier layer for reducing the effect of poisoning a photoresist layer by a dielectric layer on a semiconductor substrate; or the like.

Furthermore, the resist underlayer film formed from the resist underlayer film-forming composition can be used as an embedding material that is applied to a substrate having via holes formed therein for use in a dual damascene process and can fill up the holes without space. Furthermore, the resist underlayer film can be used as a flattening material to make the surface of a semiconductor substrate having projections and recesses flat.

Furthermore, as an EUV resist underlayer film, the resist underlayer film formed from the resist underlayer film-forming composition not only can function as a hard mask, but can also be used for the purpose below. That is, the resist underlayer film-forming composition can be used for an anti-reflective EUV resist underlayer coating that is capable of, without intermixing with an EUV resist, preventing exposure light undesirable for EUV exposure (wavelength of 13.5 nm), such as above-mentioned UV and DUV (ArF laser, KrF laser), from reflecting from a substrate or an interface. The reflection can be efficiently prevented in the underlayer of the EUV resist. In the case where the resist underlayer film formed from the resist underlayer film-forming composition is used as an EUV resist underlayer film, the film can be processed in the same manner as in the case of the underlayer film for photoresists.

EXAMPLES (Synthesis of 4-(trimethoxysilyl)benzyl acetate)

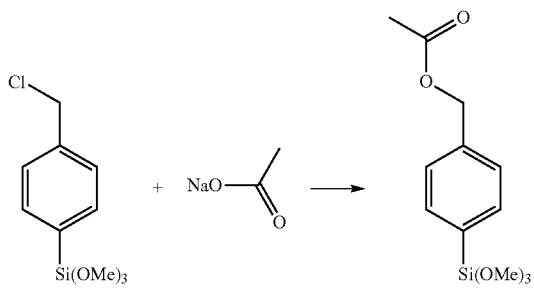

Into a 300-mL three-neck flask equipped with a magnetic stirrer, 30.0 g of sodium acetate and 150.0 g of N-methylpyrrolidone (hereinafter, also referred to as NMP) were introduced, and heated to 130° C. in an oil bath. To the solution, 90.25 g of (p-chloromethyl)phenyltrimethoxysilane was added dropwise, and heated and stirred for 4 hours. The obtained solution was cooled to room temperature and transferred to a separating funnel, and 300 g of toluene and 90 g of water were added thereto to wash the organic phase. After the washing was repeated 3 times, magnesium sulfate was added to the organic phase and dried, followed by filtration, and the solvent was removed by evaporation to obtain a crude product. The crude product was then purified by distillation under reduced pressure to obtain 60 g of 4-(trimethoxysilyl)benzyl acetate as a target product.

$^1$H-NMR (500 MHz, DMSO-$d_6$): 2.08 ppm (s, 3H), 3.54 ppm (s, 9H), 5.10 ppm (s, 2H), 7.42 ppm (d, 2H), 7.58 ppm (d, 2H)

Synthesis Example 1

Into a 500-mL four-neck flask equipped with a stirrer, a reflux condenser, a dropping funnel, and a thermometer, 75 g of water was fed, and 75 g of a toluene solution of 50 g (100 mol % of all the silanes) of 4-methoxybenzyltrimethoxysilane was added dropwise thereto at a reaction temperature of 20° C. After the dropwise addition, the solution was allowed to react at 20° C. for 2 hours, and left standing, and then subjected to liquid separation to recover the oil phase. Subsequently, the resultant solution was washed with a 5% sodium hydrogencarbonate aqueous solution. Next, the toluene solution was transferred to a 500-mL four-neck flask equipped with a stirrer, a distillation column, a cooler, and a thermometer, and placed in an oil bath and gradually heated to distill off toluene. After the toluene was distilled off, the temperature was further increased and the solution was aged at 200° C. for 2 hours. Subsequently, the solution was transferred to a 300-mL four-neck flask equipped with a stirrer, a reflux condenser, a dropping funnel, and a thermometer, and 210 g of acetonitrile, 78.24 g (0.522 mol) of sodium iodide, and 56.7 g (0.522 mol) of trimethylchlorosilane were sequentially added thereto, and refluxed at 70° C. for 24 hours. After the reflux, 69.0 g of water was added dropwise, and the resultant solution was refluxed at 70° C. for another 6 hours. Then, the solution was cooled to room temperature, and a sodium hydrogen sulfite aqueous solution was added thereto to reduce free iodine. Furthermore, the resultant solution was washed twice with a 15% saline solution to recover the oil phase. To the resultant solution, 100.0 g of propylene glycol monomethyl ether was added, and concentrated at 40° C. under reduced pressure to obtain a 20% propylene glycol monomethyl ether solution of a hydrolysis-condensation product. The obtained polymer (corresponding to Formula (A-1)) had a GPC weight average molecular weight of Mw 3,800 in terms of polystyrene.

Synthesis Example 2

Into a 500-mL four-neck flask equipped with a stirrer, a reflux condenser, a dropping funnel, and a thermometer, 74 g of water was fed, and 74 g of a toluene solution of 36.3 g (70 mol % of all the silanes) of 4-methoxybenzyltrimethoxysilane and 12.7 g (30 mol % of all the silanes) of phenyltrimethoxysilane was added dropwise thereto at a reaction temperature of 20° C. After the dropwise addition, the solution was allowed to react at 20° C. for 2 hours, and left standing, and then subjected to liquid separation to recover the oil phase. Subsequently, the resultant solution was washed with a 5% sodium hydrogencarbonate aqueous solution. Next, the toluene solution was transferred to a 500-mL four-neck flask equipped with a stirrer, a distillation column, a cooler, and a thermometer, and placed in an oil bath and gradually heated to distill off toluene. After the toluene was distilled off, the temperature was further increased and the solution was aged at 200° C. for 2 hours. Subsequently, the solution was transferred to a 500-mL four-neck flask equipped with a stirrer, a reflux condenser, a dropping funnel, and a thermometer, and 200 g of acetonitrile, 81.1 g (0.541 mol) of sodium iodide, and 58.8 g (0.542 mol) of trimethylchlorosilane were sequentially added thereto, and refluxed at 70° C. for 24 hours. After the reflux, 67 g of water was added dropwise, and the solution was refluxed at 70° C. for another 6 hours. Then, the solution was cooled to room temperature, and a sodium hydrogen sulfite aqueous solution was added thereto to reduce free iodine. Furthermore, the resultant solution was washed twice with a 15% saline solution to recover the oil phase. To the resultant solution, 120 g of propylene glycol monomethyl ether was added, and concentrated at 40° C. under reduced pressure to obtain a 20% propylene glycol monomethyl ether solution of a hydrolysis-condensation product. The obtained polymer (corresponding to Formula (A-2)) had a GPC weight average molecular weight of Mw 4,800 in terms of polystyrene.

Synthesis Example 3

Into a 500-mL four-neck flask equipped with a stirrer, a reflux condenser, a dropping funnel, and a thermometer, 71 g of water was fed, and 71 g of a toluene solution of 25.9 g (50 mol % of all the silanes) of 4-methoxybenzyltrimethoxysilane and 21.2 g (50 mol % of all the silanes) of phenyltrimethoxysilane was added dropwise thereto at a reaction temperature of 20° C. After the dropwise addition, the solution was allowed to react at 20° C. for 2 hours, and left standing, and then subjected to liquid separation to recover the oil phase. Subsequently, the resultant solution was washed with a 5% sodium hydrogencarbonate aqueous solution. Next, the toluene solution was transferred to a 500-mL four-neck flask equipped with a stirrer, a distillation column, a cooler, and a thermometer, and placed in an oil bath and gradually heated to distill off toluene. After the toluene was distilled off, the temperature was further increased and the solution was aged at 200° C. for 2 hours. Subsequently, the solution was transferred to a 300-mL four-neck flask equipped with a stirrer, a reflux condenser, a dropping funnel, and a thermometer, and 200 g of acetonitrile, 81.1 g (0.541 mol) of sodium iodide, and 58.8 g (0.542 mol) of trimethylchlorosilane were sequentially added thereto, and refluxed at 70° C. for 24 hours. After the reflux, 67 g of water was added dropwise, and the solution was refluxed at 70° C. for another 6 hours. Then, the solution was cooled to room temperature, and a sodium hydrogen sulfite aqueous solution was added thereto to reduce free iodine. Furthermore, the resultant solution was washed twice with a 15% saline solution to recover the oil phase. To the resultant solution, 120 g of propylene glycol monomethyl ether was added, and concentrated at 40° C. under reduced pressure to obtain a 20% propylene glycol monomethyl ether solution of a hydrolysis-condensation product. The obtained polymer (corresponding to Formula (A-2)) had a GPC weight average molecular weight of Mw 5,300 in terms of polystyrene.

Synthesis Example 4

Into a 300-mL flask equipped with a stirring bar, a thermometer, and a cooling tube, 5.06 g of a 35% by mass tetramethylammoniumhydroxide aqueous solution and 44.19 g of isopropanol (2-propanol) were introduced to prepare a reaction solvent. Furthermore, a mixed solution of 12.0 g (70 mol % of all the silanes) of (4-(1-ethoxyethoxy) phenyl)trimethoxysilane, 3.56 g (30 mol % of all the silanes) of phenyltrimethoxysilane, and 7.78 g of isopropanol was prepared. While the reaction solvent was stirred with a magnetic stirrer, the mixed solution was added dropwise to the reaction solvent at room temperature. After the addition, the mixture was allowed to react for 240 minutes with the temperature being maintained at 40° C. in an oil bath, and then cooled to room temperature. The resultant reaction solution was diluted with 90 mL of ethyl acetate. To the diluted solution, 0.2 mol % hydrochloric acid was added for neutralization so that the solution was separated into two phases, and the aqueous phase of the two phases was removed. The remaining organic phase was further washed 3 times with 47 g of water. To the obtained organic phase, 30 g of propylene glycol monomethyl ether was added, and ethyl acetate, isopropanol, methanol, and water were distilled off under reduced pressure, and the resultant reaction mixture was concentrated to obtain a propylene glycol monomethyl ether solution of a hydrolysis-condensation product (polymer). The obtained polymer (corresponding to Formula (A-3)) had a GPC weight average molecular weight of Mw 4,000 in terms of polystyrene.

Synthesis Example 5

Into a 300-mL flask equipped with a stirring bar, a thermometer, and a cooling tube, 5.06 g of a 35% by mass tetramethylammoniumhydroxide aqueous solution and 44.19 g of isopropanol were introduced to prepare a reaction solvent. Furthermore, a mixed solution of 12.0 g (20 mol % of all the silanes) of (4-(1-ethoxyethoxy)phenyl)trimethoxysilane, 20.7 g (50 mol % of all the silanes) of phenyltrimethoxysilane, 6.3 g (22 mol % of all the silanes) of methyltrimethoxysilane, 6.5 g (8 mol % of all the silanes) of N-3-(trimethoxysilyl)-propyl-[1,1'-biphenyl]-2,2'-dicarboxyimide, and 7.78 g of isopropanol was prepared. While the reaction solvent was stirred with a magnetic stirrer, the mixed solution was added dropwise to the reaction solvent at room temperature. After the addition, the mixture was allowed to react for 240 minutes with the temperature being maintained at 40° C. in an oil bath, and then cooled to room temperature. The resultant reaction solution was diluted with 90 g of ethyl acetate. To the diluted solution, 0.2 mol % hydrochloric acid was added for neutralization so that the solution was separated into two phases, and the aqueous phase of the two phases was removed. The remaining organic phase was further washed 3 times with 47 g of water. To the obtained organic phase, 30 g of propylene glycol monomethyl ether was added, and ethyl acetate, isopropanol, and reaction by-products, namely, methanol, ethanol, and water were distilled off under reduced pressure, and the resultant reaction mixture was concentrated to obtain a propylene glycol monomethyl ether solution of a hydrolysis-condensation product (polymer). The obtained polymer (corresponding to Formula (A-4)) had a GPC weight average molecular weight of Mw 1,800 in terms of polystyrene.

N-3-(trimethoxysilyl)-propyl-[1,1'-biphenyl]-2,2'-dicarboxyimide corresponds to the following compound of Formula (4-1-1) and can be synthesized according to the following reaction formula by the usual method.

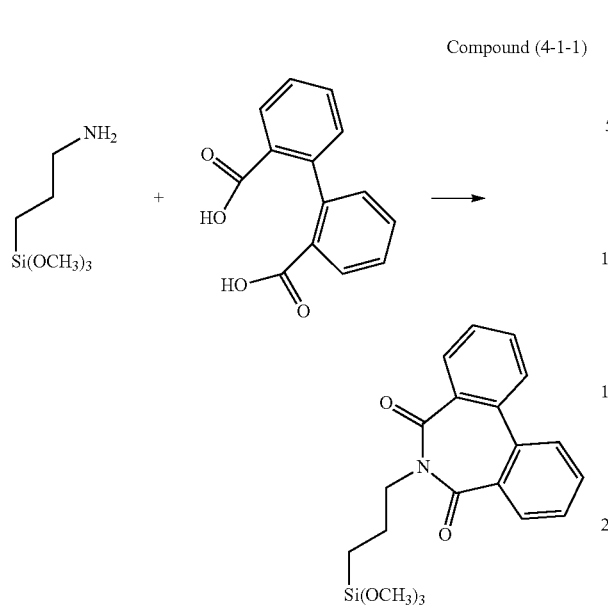

Compound (4-1-1)

Synthesis Example 6

Into a 300-mL flask equipped with a stirring bar, a thermometer, and a cooling tube, 5.90 g of a 35% by mass tetramethylammoniumhydroxide aqueous solution and 48.53 g of isopropanol were introduced to prepare a reaction solvent. Furthermore, a mixed solution of 10.0 g (50 mol % of all the silanes) of (4-(1-ethoxyethoxy)phenyl)trimethoxysilane, 5.54 g (40 mol % of all the silanes) of phenyltrimethoxysilane, and 1.55 g (10 mol % of all the silanes) of acetoxypropyltrimethoxysilane was prepared. While the reaction solvent was stirred with a magnetic stirrer, the mixed solution was added dropwise to the reaction solvent at room temperature. After the addition, the mixture was allowed to react for 240 minutes with the temperature being maintained at 40° C. in an oil bath, and then cooled to room temperature. The resultant reaction solution was diluted with 102 g of ethyl acetate. To the diluted solution, 0.2 mol % hydrochloric acid was added for neutralization so that the solution was separated into two phases, and the aqueous phase of the two phases was removed. The remaining organic phase was further washed 3 times with 52 g of water. To the obtained organic phase, 36 g of propylene glycol monomethyl ether was added, and ethyl acetate, isopropanol, and reaction by-products, namely, methanol, ethanol, and water were distilled off under reduced pressure, and the resultant reaction mixture was concentrated to obtain a propylene glycol monomethyl ether solution of a hydrolysis-condensation product (polymer). The obtained polymer (corresponding to Formula (A-5)) had a GPC weight average molecular weight of Mw 1,800 in terms of polystyrene.

(Comparative Synthesis Example 1)

5.95 g (30 mol % of all the silanes) of phenyltrimethoxysilane, 12.48 g (70 mol % of all the silanes) of methyltrimethoxysilane, and 27.64 g of acetone were introduced into a 100-mL flask. While the mixed solution was stirred with a magnetic stirrer, 5.41 g of 0.01 mol/L hydrochloric acid was added dropwise to the mixed solution. After the addition, the flask was transferred to an oil bath adjusted to 85° C. so that the resultant solution was allowed to react for 240 minutes while being heated to reflux. The reaction solution was then cooled to room temperature, and 44 g of propylene glycol monomethyl ether was added to the reaction solution, and then, reaction-by-products, namely, methanol, ethanol, water, and hydrochloric acid were distilled off under reduced pressure, and the resultant solution was concentrated to obtain a propylene glycol monomethyl ether solution of a hydrolysis-condensation product (polymer). The obtained polymer (corresponding to Formula (8-1)) had a GPC weight average molecular weight of Mw 1,200 in terms of polystyrene.

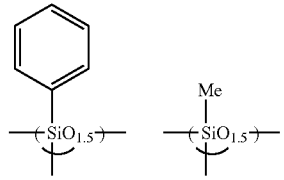

Formula (8-1)

(Synthesis of Additive 1)

Into a 300-mL flask equipped with a stirring bar, a thermometer, and a cooling tube, 6.17 g of a 35% by mass tetramethylammoniumhydroxide aqueous solution and 42.60 g of isopropanol were introduced to prepare a reaction solvent. Furthermore, a mixed solution of 10.13 g (70 mol % of all the silanes) of phenyltrimethoxysilane and 4.87 g (30 mol % of all the silanes) of acetoxypropyltrimethoxysilane was prepared. While the reaction solvent was stirred with a magnetic stirrer, the mixed solution was added dropwise to the reaction solvent at room temperature. After the addition, the mixture was allowed to react for 240 minutes with the temperature being maintained at 40° C. in an oil bath, and then cooled to room temperature. The reaction solution was diluted with 90 g of ethyl acetate. To the diluted solution, 0.2 mol % hydrochloric acid was added for neutralization so that the solution was separated into two phases, and the aqueous phase of the two phases was removed. The remaining organic phase was further washed 3 times with 45 g of water. To the obtained organic phase, 30 g of propylene glycol monomethyl ether was added, and ethyl acetate, isopropanol, and reaction by-products, namely, methanol, ethanol, and water were distilled off under reduced pressure, and the resultant reaction mixture was concentrated to obtain a propylene glycol monomethyl ether solution of a hydrolysis-condensation product (polymer). The obtained polymer (corresponding to Formula (C-1)) had a GPC weight average molecular weight of Mw 1,500 in terms of polystyrene.

(Synthesis of Additive 2)

A propylene glycol monoethyl ether solution of a polymer (corresponding to Formula (C-1)) was obtained in the same manner as in the synthesis of Additive 1, except that the amount of the 35% by mass tetramethylammoniumhydroxide aqueous solution added was changed from 6.17 g to 6.02 g; the amount of phenyltrimethoxysilane added was changed to 7.07 g (50 mol % of all the silanes); and the amount of acetoxypropyltrimethoxysilane added was changed to 7.93 g (50 mol % of all the silanes). The obtained polymer had a GPC weight average molecular weight of Mw 1,600 in terms of polystyrene.

(Synthesis of Additive 3)

Into a 300-mL flask equipped with a stirring bar, a thermometer, and a cooling tube, 5.12 g of a 35% by mass tetramethylammoniumhydroxide aqueous solution and 42.59 g of isopropanol were introduced to prepare a reaction solvent. Furthermore, a mixed solution of 8.42 g (70 mol % of all the silanes) of phenyltrimethoxysilane and 6.58 g (30 mol % of all the silanes) of N-(3-(trimethoxysilyl)propyl)benzenesulfonamide was prepared. While the reaction solvent was stirred with a magnetic stirrer, the mixed solution was added dropwise to the reaction solvent at room temperature. After the addition, the mixture was allowed to react for 240 minutes with the temperature being maintained at 40° C. in an oil bath, and then cooled to room temperature. The reaction solution was diluted with 90 g of ethyl acetate. To the diluted solution, 0.2 mol % hydrochloric acid was added for neutralization so that the solution was separated into two phases, and the aqueous phase of the two phases was removed. The remaining organic phase was further washed 3 times with 45 g of water. To the obtained organic phase, 31 g of propylene glycol monomethyl ether was added, and ethyl acetate, isopropanol, and reaction by-products, namely, methanol, ethanol, and water were distilled off under reduced pressure, and the resultant reaction mixture was concentrated to obtain a propylene glycol monomethyl ether solution of a hydrolysis-condensation product (polymer). The obtained polymer (corresponding to Formula (C-2)) had a GPC weight average molecular weight of Mw 1,800 in terms of polystyrene.

(Synthesis of Additive 4)

Into a 300-mL1 flask equipped with a stirring bar, a thermometer, and a cooling tube, 5.14 g of a 35% by mass tetramethylammoniumhydroxide aqueous solution, 21.30 g of isopropanol, and 21.30 g of tetrahydrofuran were introduced to prepare a reaction solvent. Furthermore, a mixed solution of 8.45 g (70 mol % of all the silanes) of phenyltrimethoxysilane and 6.55 g (30 mol % of all the silanes) of 5-(triethoxysilyl)norbornane-2-carboxylic acid-t-butyl was prepared. While the reaction solvent was stirred with a magnetic stirrer, the mixed solution was added dropwise to the reaction solvent at room temperature. After the addition, the mixture was allowed to react for 240 minutes with the temperature being maintained at 40° C. in an oil bath, and then cooled to room temperature. The reaction solution was diluted with 90 g of ethyl acetate. To the diluted solution, 0.2 mol % hydrochloric acid was added for neutralization so that the solution was separated into two phases, and the aqueous phase of the two phases was removed. The remaining organic phase was further washed 3 times with 45 g of water. To the obtained organic phase, 30 g of propylene glycol monomethyl ether was added, and ethyl acetate, isopropanol, and reaction by-products, namely, methanol, ethanol, and water were distilled off under reduced pressure, and the resultant reaction mixture was concentrated to obtain a propylene glycol monomethyl ether solution of a hydrolysis-condensation product (polymer). The obtained polymer (corresponding to Formula (C-3)) had a GPC weight average molecular weight of Mw 1,800 in terms of polystyrene.

(Synthesis of Additive 5)

Into a 300-mL flask equipped with a stirring bar, a thermometer, and a cooling tube, 5.15 g of a 35% by mass tetramethylammoniumhydroxide aqueous solution, 21.30 g of isopropanol, and 21.30 g of tetrahydrofuran were introduced to prepare a reaction solvent. Furthermore, a mixed solution of 10.93 g (70 mol % of all the silanes) of 5-(triethoxysilyl)norbornene and 4.07 g (30 mol % of all the silanes) of 3-acetoxypropyltrimethoxysilane was prepared. While the reaction solvent was stirred with a magnetic stirrer, the mixed solution was added dropwise to the reaction solvent at room temperature. After the addition, the mixture was allowed to react for 240 minutes with the temperature being maintained at 40° C. in an oil bath, and then cooled to room temperature. The reaction solution was diluted with 90 g of ethyl acetate. To the diluted solution, 0.2 mol % hydrochloric acid was added for neutralization so that the solution was separated into two phases, and the aqueous phase of the two phases was removed. The remaining organic phase was further washed 3 times with 45 g of water. To the obtained organic phase, 27 g of propylene glycol monomethyl ether was added, and ethyl acetate, isopropanol, and reaction by-products, namely, methanol, ethanol, and water were distilled off under reduced pressure, and the resultant reaction mixture was concentrated to obtain a propylene glycol monomethyl ether solution of a hydrolysis-condensation product (polymer). The obtained polymer (corresponding to Formula (C-4)) had a GPC weight average molecular weight of Mw 1,800 in terms of polystyrene.

(Synthesis of Additive 6)

Into a 300-mL flask equipped with a stirring bar, a thermometer, and a cooling tube, 4.40 g of a 35% by mass tetramethylammoniumhydroxide aqueous solution, 22.61 g of isopropanol, and 22.61 g of tetrahydrofuran were introduced to prepare a reaction solvent. Furthermore, a mixed solution of 9.35 g (70 mol % of all the silanes) of phenyltrimethoxysilane and 6.58 g (30 mol % of all the silanes) of di-t-butyl-2-(3-triethoxysilyl)propylmalonate was prepared. While the reaction solvent was stirred with a magnetic stirrer, the mixed solution was added dropwise to the reaction solvent at room temperature. After the addition, the mixture was allowed to react for 240 minutes with the temperature being maintained at 40° C. in an oil bath, and then cooled to room temperature. The reaction solution was diluted with 89 g of ethyl acetate. To the diluted solution, 0.2 mol % hydrochloric acid was added for neutralization so that the solution was separated into two phases, and the aqueous phase of the two phases was removed. The remaining organic phase was further washed 3 times with 48 g of water. To the obtained organic phase, 28 g of propylene glycol monomethyl ether was added, and ethyl acetate, isopropanol, and reaction by-products, namely, methanol, ethanol, and water were distilled off under reduced pressure, and the resultant reaction mixture was concentrated to obtain a propylene glycol monomethyl ether solution of a hydrolysis-condensation product (polymer). The obtained polymer (corresponding to Formula (C-5)) had a GPC weight average molecular weight of Mw 1,600 in terms of polystyrene.

(Synthesis of Additive 7)

Into a 300-mL flask equipped with a stirring bar, a thermometer, and a cooling tube, 4.42 g of a 35% by mass tetramethylammoniumhydroxide aqueous solution, 19.34 g of isopropanol, and 19.34 g of tetrahydrofuran were introduced to prepare a reaction solvent. Furthermore, a mixed solution of 9.38 g (70 mol % of all the silanes) of phenyltrimethoxysilane and 4.24 g (30 mol % of all the silanes) of 4-(trimethoxysilyl)benzylacetate was prepared. While the reaction solvent was stirred with a magnetic stirrer, the mixed solution was added dropwise to the reaction solvent at room temperature. After the addition, the mixture was allowed to react for 240 minutes with the temperature being maintained at 40° C. in an oil bath, and then cooled to room temperature. The reaction solution was diluted with 82 g of ethyl acetate. To the diluted solution, 0.2 mol % hydrochloric acid was added for neutralization so that the solution was separated into two phases, and the aqueous phase of the two phases was removed. The remaining organic phase was further washed 3 times with 41 g of water. To the obtained organic phase, 28 g of propylene glycol monomethyl ether was added, and ethyl acetate, isopropanol, and reaction by-products, namely, methanol, ethanol, and water were distilled off under reduced pressure, and the resultant reaction mixture was concentrated to obtain a propylene glycol monomethyl ether solution of a hydrolysis-condensation product (polymer). The obtained polymer (corresponding to Formula (C-6)) had a GPC weight average molecular weight of Mw 1,600 in terms of polystyrene.

(Preparation of Resist Underlayer Film-Forming Composition)

The silicon-containing polymers and additives obtained in Synthesis Examples 1 to 6, Comparative Synthesis Example 1, and Additive Synthesis Examples 1 to 7, cross-linkable compounds, curing catalysts, and a solvent were mixed at a ratio shown in Tables 1 to 3, and each of the thus-obtained mixtures was filtered with a 0.1-μm fluororesin filter to prepare a solution of a resist underlayer film-forming composition.

In Tables 1 and 2, tetramethoxymethyl glycoluril is abbreviated as PL-LI, pyridinium-p-toluenesulfonate is abbreviated as PyPTS, (3-triethoxysilylpropyl)-4,5-dihydroimidazole is abbreviated as IMIDTEOS, propylene glycol monomethyl ether acetate is abbreviated as PGMEA, and propylene glycol monomethyl ether is abbreviated as PGME. Besides, a methylol compound trade-named TM-BIP-A (manufactured by ASAHI YUKIZAI CORPORATION), an epoxy resin having a cyclohexene oxide structure, trade-named EPOLEAD GT-401 (manufactured by Daicel Corporation), and a blocked isocyanate compound trade-named VESTANAT1358 (manufactured by EVONIK) were used.

Each of the addition amounts was expressed using parts by mass. The amount of a polymer added does not mean the mass of a polymer solution, but means the mass of the polymer.

TABLE 1

|  | Polymer | Cross-linking agent | Curing catalyst | Additive | Solvent | |
|---|---|---|---|---|---|---|
| Example 1 | Synthesis Example 1 | PL-LI | PyPTS |  | PGMEA | PGME |
| (parts by mass) | 3 | 0.6 | 0.18 |  | 70 | 30 |
| Example 2 | Synthesis Example 2 | PL-LI | PyPTS |  | PGMEA | PGME |
| (parts by mass) | 3 | 0.6 | 0.18 |  | 70 | 30 |
| Example 3 | Synthesis Example 3 | PL-LI | PyPTS |  | PGMEA | PGME |
| (parts by mass) | 3 | 0.6 | 0.18 |  | 70 | 30 |
| Example 4 | Synthesis Example 4 | PL-LI | PyPTS |  | PGMEA | PGME |
| (parts by mass) | 3 | 0.6 | 0.18 |  | 70 | 30 |
| Example 5 | Synthesis Example 5 | PL-LI | PyPTS |  | PGMEA | PGME |
| (parts by mass) | 3 | 0.6 | 0.18 |  | 70 | 30 |
| Example 6 | Synthesis Example 6 | PL-LI | PyPTS |  | PGMEA | PGME |
| (parts by mass) | 3 | 0.6 | 0.18 |  | 70 | 30 |
| Example 7 | Synthesis Example 1 | PL-LI | PyPTS | Additive 1 | PGMEA | PGME |
| (parts by mass) | 2.6 | 0.6 | 0.18 | 0.4 | 70 | 30 |
| Example 8 | Synthesis Example 1 | PL-LI | PyPTS | Additive 2 | PGMEA | PGME |
| (parts by mass) | 2.6 | 0.6 | 0.18 | 0.4 | 70 | 30 |

TABLE 2

|  | Polymer | Cross-linking agent | Curing catalyst | Additive | Solvent | |
|---|---|---|---|---|---|---|
| Example 9 | Synthesis Example 1 | PL-LI | PyPTS | Additive 3 | PGMEA | PGME |
| (parts by mass) | 2.6 | 0.6 | 0.18 | 0.4 | 70 | 30 |
| Example 10 | Synthesis Example 1 | PL-LI | PyPTS | Additive 4 | PGMEA | PGME |
| (parts by mass) | 2.6 | 0.6 | 0.18 | 0.4 | 70 | 30 |
| Example 11 | Synthesis Example 1 | PL-LI | PyPTS | Additive 5 | PGMEA | PGME |
| (parts by mass) | 2.6 | 0.6 | 0.18 | 0.4 | 70 | 30 |
| Example 12 | Synthesis Example 1 | PL-LI | PyPTS | Additive 6 | PGMEA | PGME |
| (parts by mass) | 2.6 | 0.6 | 0.18 | 0.4 | 70 | 30 |
| Example 13 | Synthesis Example 1 | PL-LI | PyPTS | Additive 7 | PGMEA | PGME |
| (parts by mass) | 2.6 | 0.6 | 0.18 | 0.4 | 70 | 30 |
| Example 14 | Synthesis Example 1 | TM-BIP-A | PyPTS |  | PGMEA | PGME |
| (parts by mass) | 3 | 0.6 | 0.18 |  | 70 | 30 |
| Example 15 | Synthesis Example 1 | GT-401 |  |  | PGMEA | PGME |
| (parts by mass) | 3 | 0.6 |  |  | 70 | 30 |
| Example 16 | Synthesis Example 1 | VESTANAT1358 |  |  | PGMEA | PGME |
| (parts by mass) | 3 | 0.6 |  |  | 70 | 30 |

TABLE 3

| | Polymer | Cross-linking agent | Curing catalyst | Additive | Solvent |
|---|---|---|---|---|---|
| Comparative Example 1 (parts by mass) | Comparative Synthesis Example 1 3 | | PyPTS 0.18 | PGMEA 70 | PGME 30 |
| Comparative Example 2 (parts by mass) | Comparative Synthesis Example 1 3 | PL-LI 0.6 | PyPTS 0.18 | PGMEA 70 | PGME 30 |
| Comparative Example 3 (parts by mass) | Comparative Synthesis Example 1 3 | | IMIDTEOS 0.18 | PGMEA 70 | PGME 30 |

(Evaluation of Solvent Resistance)

Each of the resist underlayer film materials was applied onto a silicon wafer by spin-coating, and the applied coating was baked on a hot plate at 215° C. for 1 minute. Subsequently, the applied coating was immersed in trade-named OK73 thinner (manufactured by TOKYO OHKA KOGYO CO., LTD., and composed of propylene glycol monomethyl ether at a proportion of 70%+propylene glycol monomethyl ether acetate at a proportion of 30%) for 1 minute, and a change in the thickness of the film before and after the immersion was examined. A film having a change in film thickness of 1 nm or less was evaluated as good and marked with a circle (○). By contrast, a film having a change in film thickness of more than 2 nm was evaluated as poor and marked with a cross (x).

(Evaluation of Developing Solution Resistance)

Each of the resist underlayer film materials was applied onto a silicon wafer by spin-coating, and the applied coating was baked on a hot plate at 215° C. for 1 minute. Subsequently, the applied coating was immersed in a 2.38% by mass tetramethylammoniumhydroxide solution for 1 minute, and a change in film thickness before and after the immersion was examined. A film having a change in film thickness before and after the immersion of 1 nm or less was evaluated as good and marked with a circle (○). By contrast, a film having a change in film thickness of more than 2 nm was evaluated as poor and marked with a cross (x).

(Evaluation of Removability by Wet Process)

A silicon-containing film formed from each of the silicon-containing film-forming compositions obtained above was immersed at 50° C. for 30 seconds in a sulfuric acid-hydrogen peroxide mixture obtained by mixing 96% sulfuric acid with a 35% hydrogen peroxide solution at a ratio of 3 to 1, and the peelability was examined. The evaluation results about the removability by wet process were shown in Table 4, using angstrom/min.

TABLE 4

| | Solvent resistance | Developing solution resistance | Removability by wet process |
|---|---|---|---|
| Example 1 | ○ | ○ | 540 Å/min |
| Example 2 | ○ | ○ | 560 Å/min |
| Example 3 | ○ | ○ | 480 Å/min |
| Example 4 | ○ | ○ | 560 Å/min |
| Example 5 | ○ | ○ | 520 Å/min |
| Example 6 | ○ | ○ | 440 Å/min |
| Example 7 | ○ | ○ | 540 Å/min |
| Example 8 | ○ | ○ | 580 Å/min |
| Example 9 | ○ | ○ | 520 Å/min |
| Example 10 | ○ | ○ | 500 Å/min |
| Example 11 | ○ | ○ | 510 Å/min |
| Example 12 | ○ | ○ | 540 Å/min |
| Example 13 | ○ | ○ | 490 Å/min |
| Example 14 | ○ | ○ | 520 Å/min |
| Example 15 | ○ | ○ | 590 Å/min |
| Example 16 | ○ | ○ | 530 Å/min |
| Comparative Example 1 | X | X | 800 Å/min or more |
| Comparative Example 2 | ○ | ○ | 5 Å/min |
| Comparative Example 3 | ○ | ○ | 3 Å/min |

(Preparation of Organic Underlayer Film (Layer A)-Forming Composition)

In an atmosphere of nitrogen, carbazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), and p-toluenesulfonic acid monohydrate (0.76 g, 0.0040 mol, manufactured by Tokyo Chemical Industry Co., Ltd.) were introduced into a 100-mL four-neck flask, and 1,4-dioxane (6.69 g, manufactured by KANTO CHEMICAL CO., INC.) was charged therein and stirred. The resultant mixture was dissolved with the temperature increased to 100° C. to initiate polymerization. After 24 hours, the product was left cool to 60° C., and then, chloroform (34 g, manufactured by KANTO CHEMICAL CO., INC.) was added to dilute the product, and the resultant product was reprecipitated in methanol (168 g, manufactured by KANTO CHEMICAL CO., INC.). The obtained precipitate was filtered and dried with a vacuum drier at 80° C. for 24 hours, yielding in 9.37 g of a polymer (Formula (9-1), hereinafter abbreviated as PCzFL) as a target product.

Formula (9-1)

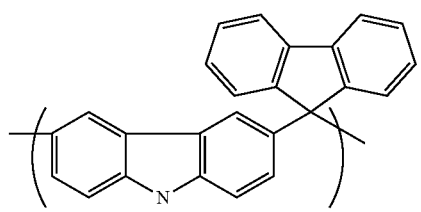

The measurement results of $^1$H-NMR of PCzFL were as follows.

$^1$H-NMR (400 MHz, DMSO-$d_6$): δ7.03-7.55 (br, 12H), δ7.61-8.10 (br, 4H), δ11.18 (br, 1H)

The weight average molecular weight Mw of PCzFL measured by GPC in terms of polystyrene was 2,800, and the degree of poly-distribution Mw/Mn was 1.77.

With 20 g of the obtained resin, 3.0 g of tetramethoxymethyl glycoluril (the trade name Powderlink 1174, manufactured by Mitsui Cytec Ltd.) as a crosslinking agent, 0.30 g of pyridinium p-toluenesulfonate as a catalyst, and 0.06 g of MEGAFAC R-30 (the trade name, manufactured by DIC Corporation) as a surfactant were mixed. The mixture was dissolved in 88 g of propylene glycol monomethyl ether acetate to form a solution. The solution was then filtered with a polyethylene microfilter having a pore size of 0.10 μm, and further filtered with a polyethylene microfilter having a pore size of 0.05 μm to prepare a solution of an organic underlayer film (Layer A) forming composition used for a lithography process using a multilayer film.

(Evaluation of Resist Patterning)

The organic underlayer film (Layer A)-forming composition obtained in accordance with the above-mentioned formula was applied onto a silicon wafer, and the applied coating was baked on a hot plate at 205° C. for 60 seconds to obtain an organic underlayer film (Layer A) having a film thickness of 200 nm. Each of the Si-containing resist underlayer film (Layer B)-forming compositions obtained in Examples 1 to 16 and Comparative Examples 1 to 3 was applied onto Layer A, and the applied coating was baked on a hot plate at 215° C. for 60 seconds to obtain a Si-containing resist underlayer film (Layer B). The Si-containing resist underlayer film (Layer B) had a film thickness of 80 nm.

Onto each of Layer B, a commercially available photoresist solution (trade name: SEPR430, manufactured by Shin-Etsu Chemical Co., Ltd.) was applied by a spinner, and heated on a hot plate at 100° C. for 1 minute to form a photoresist film (Layer C) having a film thickness of 550 nm.

Using a KrF scanner, S-205C, manufactured by NIKON CORPORATION (wavelength: 248 nm), exposure was performed through a mask set so as to form a 160-nm line/space pattern. After the exposure, the target was heated at 110° C. for 90 seconds, and then, using a 2.38% tetramethylammoniumhydroxide solution (trade name: NMD-3, manufactured by TOKYO OHKA KOGYO CO., LTD.) as a developer for photoresists, puddle development was performed for 60 seconds. The obtained photoresist pattern was evaluated as good when the pattern had no large pattern-peeling, no undercut, or no widening (footing) at the line bottom.

TABLE 5

| Pattern shape | |
|---|---|
| | Line-to-space ratio of pattern 1/1 |
| Example 1 | Good |
| Example 2 | Good |
| Example 3 | Good (partial peeling) |
| Example 4 | Good |
| Example 5 | Good |
| Example 6 | Good |
| Example 7 | Good |
| Example 8 | Good |
| Example 9 | Good |
| Example 10 | Good |
| Example 11 | Good |
| Example 12 | Good |
| Example 13 | Good |
| Example 14 | Good |
| Example 15 | Good |

TABLE 5-continued

| Pattern shape | |
|---|---|
| | Line-to-space ratio of pattern 1/1 |
| Example 16 | Good (partial footing) |
| Comparative Example 1 | Poor (large peeling) |
| Comparative Example 2 | Poor (large peeling) |
| Comparative Example 3 | Good |

INDUSTRIAL APPLICABILITY

Provided is a resist underlayer film-forming composition for lithography that is usable for the manufacture of semiconductor devices. Provided is a resist underlayer film-forming composition for lithography for forming a resist underlayer film usable as a hard mask. Furthermore, provided is a resist underlayer film-forming composition for lithography for forming a resist underlayer film usable as an anti-reflective coating.

A resist underlayer film obtained from the resist underlayer film-forming composition according to the present invention is removable by wet etching because the film can be decomposed by a chemical solution of, for example, sulfuric acid/hydrogen peroxide.

The invention claimed is:

1. A resist underlayer film-forming composition, the composition being configured such that it can form a film that can be removed with a chemical solution comprising a mixed solution of sulfuric acid and hydrogen peroxide, the composition comprising a component (A) being an underlayer film-forming polymer, wherein the component (A) is selected from the group consisting of Formula (A-1), Formula (A-2), Formula (A-3), Formula (A-4), and Formula (A-5):

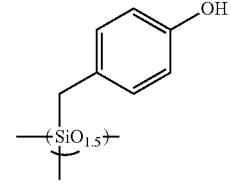

Formula (A-1)

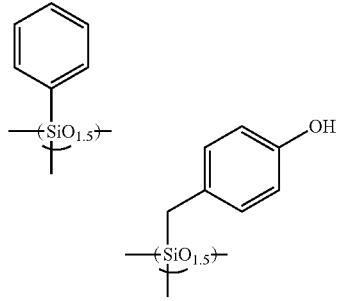

Formula (A-2)

Formula A-3)

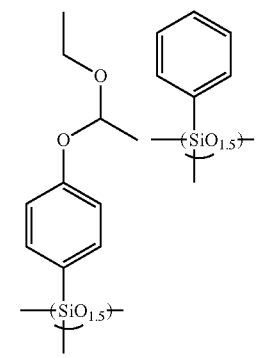

Formula (A-4)

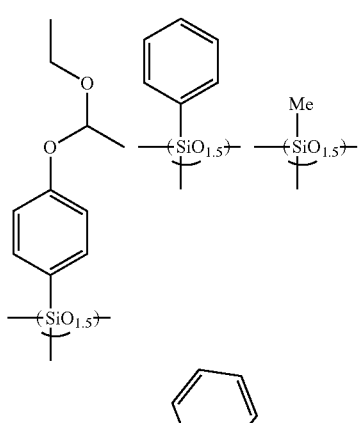

Formula (A-5)

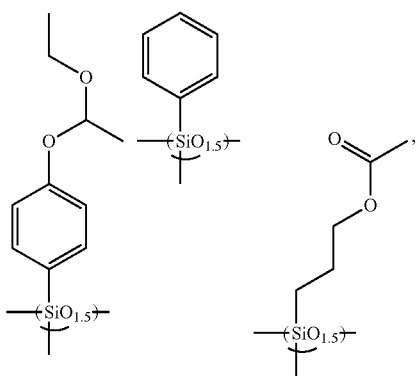

and the component (A) has a weight-average molecular weight in the range of from 1,800 to 5,300 g/mol, a component (B) being an organic cross-linkable compound having a ring structure having an alkoxymethyl group or a hydroxymethyl group, or an organic cross-linkable compound having an epoxy group or a blocked isocyanate group; and a component (C) that comprises a hydrolyzable silane, a hydrolysis product thereof, or a hydrolysis-condensation product thereof, wherein the component (C) is selected from the group consisting of Formula (C-1), Formula (C-2), Formula (C-3), Formula (C-4), Formula (C-5), and Formula (C-6):

Formula (C-1)

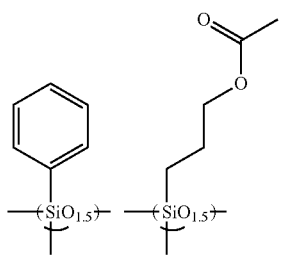

Formula (C-2)

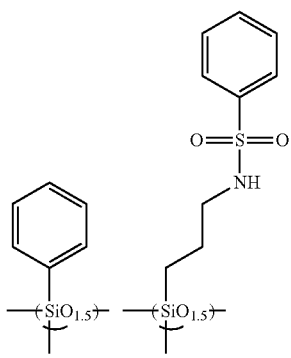

Formula (C-3)

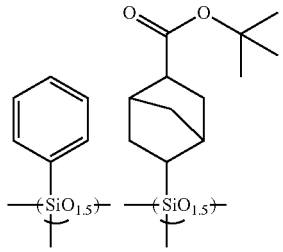

Formula (C-4)

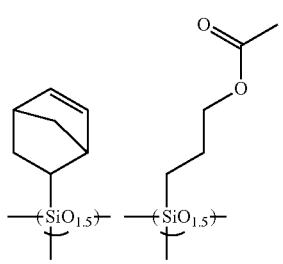

-continued

Formula (C-5)

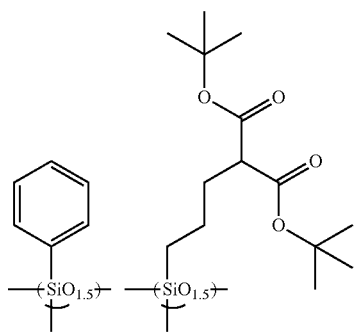

Formula (C-6)

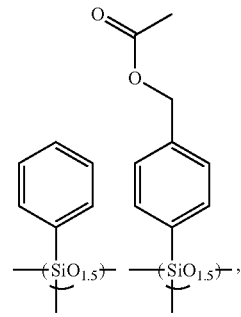

and
the component (C) has a weight-average molecular weight in the range of from 1,500 to 1,800 g/mol.

2. The resist underlayer titin-forming composition according to claim 1, wherein the alkoxymethyl group of the component (B) is a methoxymethyl group.

3. The resist underlayer film-forming composition according to claim 1, the composition further comprising an acid.

4. The resist underlayer film-forming composition according to claim 1, wherein the mixed solution of sulfuric acid and hydrogen peroxide is obtained by mixing 96% sulfuric acid with a 35% hydrogen peroxide solution at a ratio of 3 to 1.

5. The resist underlayer film-forming composition according to claim 1, wherein the resist underlayer film-forming composition comprises a polymer formed from the component (A), the component (B), and the component (C), and the polymer makes up the film that can be removed With the chemical solution, and the mixed solution of sulfuric acid and hydrogen peroxide is obtained by mixing 96% sulfuric acid with a 35% hydrogen peroxide solution at a ratio of 3 to 1.

6. The resist underlayer film-forming composition according to claim 1, wherein the component (C) is a polymer of the Formula (C-2).

7. A method for forming a resist underlayer film, the method comprising:
applying the resist underlayer film-forming composition as claimed in claim 1 onto a semiconductor substrate and baking the applied coating to form an underlayer film.

8. A method for manufacturing a semiconductor device, the method comprising:
applying the resist underlayer film-forming composition as claimed in claim 1 onto a semiconductor substrate, and baking the applied coating to form a resist underlayer film;
applying a resist composition onto the underlayer film to form a resist film;
exposing the resist film to light;
developing the resist after the exposure to obtain a resist pattern;
etching the resist underlayer film with the resist pattern; and
processing the semiconductor substrate with the patterned resist underlayer film.

9. A method for manufacturing a semiconductor device, the method comprising:
forming an organic underlayer film on a semiconductor substrate;
applying the resist underlayer film-forming composition as claimed in claim 1 onto the organic underlayer film and baking the applied coating to form a resist underlayer film;
applying a resist composition onto the resist underlayer film to form a resist film;
exposing the resist film to light;
developing the resist after the exposure to obtain a resist pattern;
etching the resist underlayer film with the resist pattern;
etching the organic underlayer film with the patterned resist underlayer film; and
processing the semiconductor substrate with the patterned organic underlayer film.

10. The method for manufacturing a semiconductor device according to claim 9, the method further comprising, after the processing of the semiconductor substrate, removing the patterned resist underlayer film and/or the patterned organic underlayer film by a chemical solution.

11. The method for manufacturing a semiconductor device according to claim 10, wherein the chemical solution used for the removal is a mixed solution of sulfuric acid and hydrogen peroxide.

12. A resist underlayer film-forming composition, the composition being configured such that it can form a film that can be removed with a chemical solution comprising a mixed solution of sulfuric acid and hydrogen peroxide, the composition comprising
a component (A) being an underlayer film-forming polymer, which is a hydrolysis-condensation product of a hydrolyzable silane comprising a combination of the hydrolyzable silane of Formula (I):

$$R^1_a R^2_b Si(R^3)_{4-(a+b)}$$ Formula (I)

wherein $R^1$ is an organic group of Formula (2):

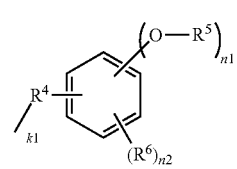

Formula (2)

wherein:
$R^4$ is a cyclic alkylene group or an arylene group, or a combination thereof;
$R^5$ is a hydrogen atom or a $C_{2-10}$ alkoxyalkyl group;
$R^6$ is a $C_{1-10}$ alkyl group;
n1 satisfies $1 \leq n1 \leq 5$;
n2 satisfies $0 \leq n2 \leq 4$; and
a k1 portion is a bond to a silicon atom, and is bonded to a silicon atom through a Si—C bond;

$R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or a combination thereof, and is bonded to a silicon atom through a Si—C bond;

$R^3$ is an alkoxy group, an acyloxy group, or a halogen group;

a is an integer of 1;

b is an integer of 0 to 2; and a b is an integer of 1 to 3, a component (B) being an organic cross-linkable compound having a ring structure having an alkoxymethyl group or a hydroxymethyl group, or an organic cross-linkable compound having an epoxy group or a blocked isocyanate group; and a component (C) that comprises a hydrolyzable silane, a hydrolysis product thereof, or a hydrolysis-condensation product thereof, the hydrolyzable silane being a hydrolyzable silane of Formula (5), a combination of the hydrolyzable silane of Formula (5) and a hydrolyzable silane of Formula (3), or a combination of the hydrolyzable silane of Formula (5), the hydrolyzable silane of Formula (3), and a hydrolyzable silane of Formula (4):

$$R^7{}_c Si(R^8)_{4-c} \qquad \text{Formula (3)}$$

wherein:

$R^7$ is an alkyl group, an aryl group, a halogenated alkyl group, a halogenated aryl group, an alkenyl group, an acyloxyalkyl group, or an organic group having a urea group, an epoxy group, an acryloyl group, a methacryloyl group, a mercapto group, or a cyano group, or a combination thereof, and is bonded to a silicon atom through a Si—C bond; and $R^8$ is an alkoxy group, an acyloxy group, or a halogen group; and c is an integer of 0 to 3;

$$[R^9{}_d Si(R^{10})_{3-d}]_2 Y_e \qquad \text{Formula (4)}$$

wherein:

$R^9$ is an alkyl group and is bonded to a silicon atom through a Si—C bond;

$R^{10}$ is an alkoxy group, an acyloxy group, or a halogen group;

Y is an alkylene group or an arylene group; d is an integer of 0 or 1;

and e is an integer of 0 or 1;

$$R^{11}{}_a R^{12}{}_b Si(R^{13})_{4-(a+b)} \qquad \text{Formula (5)}$$

wherein:

$R^{11}$ is an organic group having an acyloxy group, a sulfonamide group, or a t-butyl ester group, and is bonded to a silicon atom through a Si—C bond;

$R^{12}$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, or a combination thereof, and is bonded to a silicon atom through a Si—C bond;

$R^{13}$ is an alkoxy group, an acyloxy group, or a halogen group;

a is an integer of 1;

b is an integer of 0 to 2; and a+b is an integer of 1 to 3.

13. The resist underlayer film-forming composition according to claim 12, wherein the alkoxymethyl group of the component (B) is a methoxymethyl group.

14. The resist underlayer film-forming composition according to claim 12, the composition further comprising an acid.

15. The resist underlayer film-forming composition according to claim 12, wherein the mixed solution of sulfuric acid and hydrogen peroxide is obtained by mixing 96% sulfuric acid with a 35% hydrogen peroxide solution at a ratio of 3 to 1.

16. The resist underlayer film-forming composition according to claim 12, wherein the resist underlayer film-forming composition comprises a polymer formed from the component (A), the component (B), and the component (C), and the polymer makes up the film that can be removed with the chemical solution, and the mixed solution of sulfuric acid and hydrogen peroxide is obtained by mixing 96% sulfuric acid with a 35% hydrogen peroxide solution at a ratio of 3 to 1.

17. The resist underlayer film-forming composition according to claim 12, wherein $R^3$ is the alkoxy group.

18. The resist underlayer film-forming composition according to claim 12, wherein $R^3$ is the acyloxy group.

19. The resist underlayer film-forming composition according to claim 12, wherein $R^3$ is the halogen group.

* * * * *